US011751350B2

(12) United States Patent
Sullivan

(10) Patent No.: US 11,751,350 B2
(45) Date of Patent: Sep. 5, 2023

(54) SYSTEMS AND METHODS FOR PROVIDING A ROBUST COMPUTER PROCESSING UNIT

(71) Applicant: ATD VENTURES, LLC, Logan, UT (US)

(72) Inventor: Jason A. Sullivan, Youngstown, OH (US)

(73) Assignee: ATD Ventures, LLC, Logan, UT (US)

(*) Notice: Subject to any disclaimer, the term of this patent is extended or adjusted under 35 U.S.C. 154(b) by 0 days.

(21) Appl. No.: 17/100,728

(22) Filed: Nov. 20, 2020

(65) Prior Publication Data

US 2021/0076523 A1     Mar. 11, 2021

Related U.S. Application Data

(63) Continuation of application No. 16/404,576, filed on May 6, 2019, now Pat. No. 10,849,245, which is a
(Continued)

(51) Int. Cl.
*G06F 1/16*     (2006.01)
*H05K 5/00*     (2006.01)
(Continued)

(52) U.S. Cl.
CPC ............ *H05K 5/04* (2013.01); *G06F 1/1601* (2013.01); *G06F 1/1613* (2013.01);
(Continued)

(58) Field of Classification Search
CPC .......... H05K 5/04; H05K 5/03; G06F 1/1601; G06F 1/1613; G06F 1/1632; G06F 1/1656; G06F 1/181
See application file for complete search history.

(56) References Cited

U.S. PATENT DOCUMENTS 744,897 A    11/1903   Braun
2,270,315 A    1/1942   Kraus
(Continued)

FOREIGN PATENT DOCUMENTS

AU    2003290533 B2   5/2004
AU    2009201313 A1   4/2009
(Continued)

OTHER PUBLICATIONS

Anonymous, "PICOPSU-80 12V 80 Volt ATX Power Supply", Jan. 26, 2010, pp. 1-4, retrieved from www.mini-box.com/picoPSU-80.
(Continued)

*Primary Examiner* — Anthony M Haughton
(74) *Attorney, Agent, or Firm* — David B. Tingey; Bryant J. Keller; Kirton McConkie

(57) ABSTRACT

The present invention features a robust customizable computing system comprising: a processing control unit; an external object; and means for operably connecting the processing control unit to the external object, the processing control unit introducing intelligence into the external object, thus causing the external object to perform smart functions. The processing control unit preferably comprises: (a) an encasement module comprising a main support chassis having a plurality of wall supports and a plurality of junction centers containing means for supporting a computer component therein, a dynamic back plane that provides support for connecting peripheral and other computing components directly to a system bus without requiring an interface, means for enclosing the main support chassis and providing access to an interior portion of the encasement module; (b) one or more computer processing components disposed within the junction centers of the encasement module; and (c) means for cooling the interior portion of the encasement module.

20 Claims, 23 Drawing Sheets

Related U.S. Application Data continuation of application No. 14/642,644, filed on Mar. 9, 2015, now Pat. No. 10,285,293, which is a continuation of application No. 12/795,439, filed on Jun. 7, 2010, now Pat. No. 8,976,513, which is a continuation of application No. 11/827,360, filed on Jul. 9, 2007, now Pat. No. 7,733,635, which is a continuation of application No. 10/692,005, filed on Oct. 22, 2003, now Pat. No. 7,242,574.

(60) Provisional application No. 60/455,789, filed on Mar. 19, 2003, provisional application No. 60/420,127, filed on Oct. 22, 2002.

(51) Int. Cl.
*H05K 7/00* (2006.01)
*H05K 5/04* (2006.01)
*G06F 1/18* (2006.01)
*G06F 1/20* (2006.01)
*H05K 5/03* (2006.01)

(52) U.S. Cl.
CPC .......... *G06F 1/1632* (2013.01); *G06F 1/1656* (2013.01); *G06F 1/181* (2013.01); *G06F 1/20* (2013.01); *H05K 5/03* (2013.01)

(56) References Cited

U.S. PATENT DOCUMENTS

| | | | |
|---|---|---|---|
| 3,787,818 A | 1/1974 | Arnold et al. | |
| 3,896,419 A | 7/1975 | Lange et al. | |
| 3,921,177 A | 11/1975 | Munson | |
| 3,932,016 A | 1/1976 | Ammenheuser | |
| 4,232,356 A | 11/1980 | Saunders et al. | |
| 4,389,080 A | 6/1983 | Clark et al. | |
| 4,437,074 A | 3/1984 | Cohen et al. | |
| 4,479,198 A | 10/1984 | Romano et al. | |
| 4,511,964 A | 4/1985 | Georg et al. | |
| 4,791,531 A | 12/1988 | Jessup | |
| 4,814,777 A | 3/1989 | Monser | |
| 4,814,970 A | 3/1989 | Barbagelata et al. | |
| 4,816,993 A | 3/1989 | Takashashi et al. | |
| 4,829,372 A | 5/1989 | McCalley et al. | |
| 4,837,735 A | 6/1989 | Allen et al. | |
| 4,843,403 A | 6/1989 | Lalezari et al. | |
| 4,853,704 A | 8/1989 | Diaz | |
| 4,876,644 A | 10/1989 | Nuechterlein et al. | |
| 5,036,335 A | 7/1991 | Jairam | |
| 5,051,868 A * | 9/1991 | Leverault | G06F 1/182 |
| | | | 361/740 |
| 5,076,794 A | 12/1991 | Ganthier | |
| 5,094,624 A | 3/1992 | Bakke et al. | |
| 5,124,712 A | 6/1992 | Caille et al. | |
| 5,124,733 A | 6/1992 | Haneishi | |
| 5,131,140 A | 7/1992 | Zimmer | |
| 5,136,718 A | 8/1992 | Haydt | |
| 5,142,255 A | 8/1992 | Chang et al. | |
| 5,181,855 A | 1/1993 | Mosquera et al. | |
| 5,227,957 A * | 7/1993 | Deters | G06F 1/181 |
| | | | 439/74 |
| 5,251,097 A | 10/1993 | Simmons et al. | |
| 5,278,730 A | 1/1994 | Kikinis | |
| 5,311,397 A | 5/1994 | Harshberger et al. | |
| 5,329,418 A | 7/1994 | Tanabe | |
| 5,349,132 A | 9/1994 | Miller et al. | |
| 5,377,356 A | 12/1994 | Molyneaux | |
| 5,383,192 A | 1/1995 | Alexander | |
| 5,390,081 A | 2/1995 | St. Pierre | |
| 5,419,712 A | 5/1995 | Bellomo et al. | |
| 5,430,607 A | 7/1995 | Smith | |
| 5,438,476 A | 8/1995 | Steffes | |
| 5,449,297 A | 9/1995 | Bellomo et al. | |
| 5,504,918 A | 4/1996 | Collette et al. | |
| 5,534,880 A | 7/1996 | Button et al. | |
| 5,539,616 A | 7/1996 | Kikinis | |
| 5,541,611 A | 7/1996 | Peng et al. | |
| 5,557,291 A | 9/1996 | Chu et al. | |
| 5,589,406 A | 12/1996 | Kato et al. | |
| 5,600,538 A | 2/1997 | Xanthopoulos | |
| 5,602,721 A | 2/1997 | Slade et al. | |
| 5,625,531 A | 4/1997 | Padilla et al. | |
| 5,640,430 A | 6/1997 | Cudak et al. | |
| 5,646,823 A | 7/1997 | Amori | |
| 5,661,494 A | 8/1997 | Bondyopadhyay | |
| 5,663,867 A | 9/1997 | Honda et al. | |
| 5,671,430 A | 9/1997 | Gunzinger | |
| 5,689,406 A | 11/1997 | Wood et al. | |
| 5,689,654 A | 11/1997 | Kikinis et al. | |
| 5,694,294 A | 12/1997 | Ohashi et al. | |
| 5,696,983 A | 12/1997 | Watanabe et al. | |
| 5,701,231 A | 12/1997 | Do et al. | |
| 5,736,796 A | 4/1998 | Price | |
| 5,754,396 A * | 5/1998 | Felcman | G06F 1/183 |
| | | | 361/725 |
| 5,761,033 A | 6/1998 | Wilhelm | |
| 5,761,034 A * | 6/1998 | Chu | G06F 1/1688 |
| | | | 361/679.48 |
| 5,774,337 A | 6/1998 | Lee et al. | |
| 5,784,252 A | 7/1998 | Villa et al. | |
| 5,786,984 A | 7/1998 | Bonardi et al. | |
| 5,793,616 A | 8/1998 | Aubuchon et al. | |
| 5,793,806 A | 8/1998 | Maeda et al. | |
| 5,801,072 A | 9/1998 | Barber | |
| 5,805,474 A | 9/1998 | Danielson et al. | |
| 5,822,608 A | 10/1998 | Dieffenderfer et al. | |
| 5,844,824 A | 12/1998 | Newman et al. | |
| 5,845,391 A | 12/1998 | Bellus et al. | |
| 5,863,211 A | 1/1999 | Sobotta et al. | |
| 5,896,273 A | 4/1999 | Varghese et al. | |
| 5,909,357 A | 6/1999 | Orr | |
| 5,938,757 A | 8/1999 | Bertsch | |
| 5,940,274 A | 8/1999 | Sato et al. | |
| 5,948,087 A | 9/1999 | Khan et al. | |
| 5,949,644 A | 9/1999 | Park | |
| 5,964,854 A | 10/1999 | Roozenbeek et al. | |
| 5,992,955 A | 11/1999 | Yang | |
| 5,996,831 A | 12/1999 | Teok | |
| 5,999,952 A | 12/1999 | Jenkins et al. | |
| 6,003,100 A | 12/1999 | Lee | |
| 6,005,767 A | 12/1999 | Ku et al. | |
| 6,011,330 A | 1/2000 | Goodman et al. | |
| 6,018,456 A | 1/2000 | Young et al. | |
| 6,021,453 A | 2/2000 | Klingman | |
| 6,023,507 A | 2/2000 | Wookey | |
| 6,029,183 A | 2/2000 | Jenkins et al. | |
| 6,032,257 A | 2/2000 | Olarig et al. | |
| 6,035,356 A | 3/2000 | Khan et al. | |
| 6,037,846 A | 3/2000 | Oberhammer | |
| 6,043,987 A | 3/2000 | Goodwin et al. | |
| 6,049,449 A | 4/2000 | Cranston, III et al. | |
| 6,058,011 A | 5/2000 | Hardt et al. | |
| 6,137,686 A | 10/2000 | Saye | |
| 6,151,209 A | 11/2000 | Lee et al. | |
| 6,151,650 A | 11/2000 | Birzer | |
| 6,153,881 A | 11/2000 | Castleman | |
| 6,157,533 A | 12/2000 | Sallam et al. | |
| 6,157,537 A | 12/2000 | Cheng | |
| 6,178,084 B1 | 1/2001 | Shibasaki | |
| 6,181,549 B1 | 1/2001 | Mills et al. | |
| 6,188,571 B1 | 2/2001 | Roganti et al. | |
| 6,191,750 B1 | 2/2001 | Bonebright | |
| 6,192,577 B1 | 2/2001 | Larsson | |
| 6,216,185 B1 | 4/2001 | Chu | |
| 6,220,346 B1 | 4/2001 | Gissler | |
| 6,222,735 B1 | 4/2001 | Leman et al. | |
| 6,229,700 B1 | 5/2001 | Liu et al. | |
| 6,229,710 B1 | 5/2001 | Chen | |
| 6,246,573 B1 | 6/2001 | Khan et al. | |
| 6,259,605 B1 | 7/2001 | Schmitt | |
| 6,261,104 B1 | 7/2001 | Leman | |
| 6,275,922 B1 | 8/2001 | Bertsch | |
| 6,282,433 B1 | 8/2001 | Holshouser | |
| 6,288,893 B1 | 9/2001 | Faranda et al. | |

(56) References Cited

U.S. PATENT DOCUMENTS

| | | | |
|---|---|---|---|
| 6,292,718 B2 | 9/2001 | Staiger | |
| 6,304,459 B1 | 10/2001 | Toyosato et al. | |
| 6,307,742 B1 | 10/2001 | Diaz et al. | |
| 6,321,335 B1 | 11/2001 | Chu | |
| 6,327,152 B1 | 12/2001 | Saye | |
| 6,331,938 B1 | 12/2001 | Hsieh et al. | |
| 6,349,038 B1 | 2/2002 | Hailey | |
| 6,351,246 B1 | 2/2002 | McCorkle | |
| 6,351,375 B1 | 2/2002 | Hsieh et al. | |
| 6,369,849 B1 | 4/2002 | Rzyski | |
| 6,370,546 B1 | 4/2002 | Kondo | |
| 6,373,715 B1 | 4/2002 | Zeng et al. | |
| 6,377,446 B1 | 4/2002 | Liau | |
| 6,388,870 B1 | 5/2002 | Canova, Jr. et al. | |
| 6,388,880 B1 | 5/2002 | El-Ghobashy et al. | |
| 6,389,499 B1 | 5/2002 | Frank, Jr. et al. | |
| 6,396,453 B2 | 5/2002 | Amyotte et al. | |
| 6,446,192 B1 | 9/2002 | Narasimhan et al. | |
| 6,463,519 B1 | 10/2002 | Yoshida et al. | |
| 6,467,009 B1 | 10/2002 | Winegarden et al. | |
| 6,482,042 B1 | 11/2002 | Tupper | |
| 6,487,080 B2 | 11/2002 | Robbins et al. | |
| 6,490,157 B2 | 12/2002 | Unrein | |
| 6,501,429 B2 * | 12/2002 | Nakamura | G06F 1/1656 343/702 |
| 6,512,356 B1 | 1/2003 | Webb | |
| 6,512,488 B2 | 1/2003 | Schantz | |
| 6,512,963 B1 | 1/2003 | Felde et al. | |
| 6,523,079 B2 | 2/2003 | Kikinis et al. | |
| 6,525,696 B2 | 2/2003 | Powell et al. | |
| 6,532,152 B1 | 3/2003 | White et al. | |
| 6,542,354 B1 * | 4/2003 | Holtorf | G06F 1/1688 361/679.56 |
| 6,542,926 B2 | 4/2003 | Zalewski et al. | |
| 6,552,691 B2 | 4/2003 | Mohuchy et al. | |
| 6,567,254 B2 | 5/2003 | Bentley | |
| 6,567,272 B1 | 5/2003 | Merkin | |
| 6,574,098 B2 | 6/2003 | Netzel et al. | |
| 6,603,430 B1 | 8/2003 | Hill et al. | |
| 6,607,408 B2 | 8/2003 | Milan | |
| 6,618,698 B1 | 9/2003 | Beausoleil et al. | |
| 6,629,181 B1 | 9/2003 | Alappat et al. | |
| 6,633,231 B1 * | 10/2003 | Okamoto | G08B 25/08 379/43 |
| 6,636,918 B1 | 10/2003 | Aguilar et al. | |
| 6,636,958 B2 | 10/2003 | Abboud et al. | |
| 6,643,135 B2 | 11/2003 | Tomioka | |
| 6,650,302 B2 | 11/2003 | Sanad | |
| 6,666,705 B1 | 12/2003 | Lauruhn et al. | |
| 6,680,843 B2 | 1/2004 | Farrow et al. | |
| 6,687,128 B2 | 2/2004 | Tokuhura | |
| 6,690,576 B2 | 2/2004 | Clements et al. | |
| 6,697,032 B2 | 2/2004 | Chitturi et al. | |
| 6,703,981 B2 | 3/2004 | Meitzler et al. | |
| 6,704,838 B2 | 3/2004 | Anderson | |
| 6,714,411 B2 | 3/2004 | Thompson et al. | |
| 6,718,408 B2 | 4/2004 | Esterberg et al. | |
| 6,721,651 B1 | 4/2004 | Minelli | |
| 6,724,346 B2 | 4/2004 | Le Bolzer et al. | |
| 6,727,774 B1 | 4/2004 | Novak | |
| 6,765,539 B1 | 7/2004 | Wang et al. | |
| 6,795,926 B1 | 9/2004 | Matula et al. | |
| 6,801,307 B2 | 10/2004 | Ziegler et al. | |
| 6,804,564 B2 | 10/2004 | Crispin et al. | |
| 6,806,845 B2 | 10/2004 | Fund et al. | |
| 6,819,550 B2 | 11/2004 | Jobs et al. | |
| 6,844,851 B2 | 1/2005 | Yoon et al. | |
| 6,853,293 B2 * | 2/2005 | Swartz | G06F 1/1662 235/462.15 |
| 6,859,176 B2 | 2/2005 | Choi | |
| 6,865,076 B2 | 2/2005 | Lunsford | |
| 6,862,173 B1 | 3/2005 | Konshak et al. | |
| 6,863,211 B2 | 3/2005 | Moore et al. | |
| 6,868,602 B2 | 3/2005 | McCullough | |
| 6,871,344 B2 | 3/2005 | Grier et al. | |
| 6,881,098 B2 | 4/2005 | Jeansonne et al. | |
| 6,895,532 B2 | 5/2005 | Raynham | |
| 6,898,705 B2 | 5/2005 | Abboud et al. | |
| 6,900,383 B2 | 5/2005 | Babb et al. | |
| 6,911,947 B1 | 6/2005 | Cranor et al. | |
| 6,914,570 B2 | 7/2005 | Asrani et al. | |
| 6,941,247 B2 | 9/2005 | Voigt et al. | |
| 6,954,850 B1 | 10/2005 | Howard et al. | |
| 6,957,291 B2 | 10/2005 | Moon et al. | |
| 6,961,237 B2 | 11/2005 | Dickie | |
| 6,970,367 B2 | 11/2005 | Takeshima et al. | |
| 6,977,624 B1 | 12/2005 | Szente et al. | |
| 6,988,226 B2 | 1/2006 | Koning et al. | |
| 6,992,627 B1 | 1/2006 | Honda et al. | |
| 6,993,618 B2 | 1/2006 | Chen et al. | |
| 6,996,500 B2 | 2/2006 | O'Konski et al. | |
| 7,053,864 B1 | 5/2006 | Lee | |
| 7,057,568 B2 | 6/2006 | Louzir et al. | |
| 7,061,762 B2 | 6/2006 | Canova et al. | |
| 7,064,729 B2 | 6/2006 | Olson | |
| 7,065,381 B2 * | 6/2006 | Jenkins | H04M 1/0254 455/575.1 |
| 7,068,510 B2 | 6/2006 | Crippen et al. | |
| 7,075,784 B2 | 7/2006 | Sullivan | |
| 7,092,246 B2 | 8/2006 | Tanaka et al. | |
| 7,092,248 B2 | 8/2006 | Shu | |
| 7,103,745 B2 | 9/2006 | Koning et al. | |
| 7,119,982 B2 | 10/2006 | Starr et al. | |
| 7,155,711 B2 | 12/2006 | Vogel et al. | |
| 7,159,053 B1 | 1/2007 | Larkin | |
| 7,176,837 B2 | 2/2007 | Sonoda et al. | |
| 7,180,457 B2 | 2/2007 | Trott et al. | |
| 7,183,999 B2 | 2/2007 | Matthews | |
| 7,184,264 B2 | 2/2007 | Le et al. | |
| 7,193,565 B2 | 3/2007 | Caimi et al. | |
| 7,196,275 B2 | 3/2007 | Babb et al. | |
| 7,209,089 B2 | 4/2007 | Schantz | |
| 7,223,105 B2 | 5/2007 | Weiss et al. | |
| 7,227,751 B2 | 6/2007 | Robbins et al. | |
| 7,228,963 B1 | 6/2007 | Feibelman et al. | |
| 7,236,353 B2 | 6/2007 | Davidson et al. | |
| 7,237,138 B2 | 6/2007 | Greenwald et al. | |
| 7,239,283 B2 | 7/2007 | Chua | |
| 7,239,700 B2 | 7/2007 | Fuhrmann et al. | |
| 7,242,574 B2 | 7/2007 | Sullivan | |
| 7,245,266 B1 | 7/2007 | Szente et al. | |
| 7,245,497 B2 | 7/2007 | Klein et al. | |
| 7,256,991 B2 | 8/2007 | Sullivan | |
| 7,263,632 B2 | 8/2007 | Ritz et al. | |
| 7,271,776 B2 | 9/2007 | Le Bolzer et al. | |
| 7,277,295 B2 | 10/2007 | Zimmerman et al. | |
| 7,277,783 B2 | 10/2007 | Predelli | |
| 7,278,035 B2 | 10/2007 | Chung et al. | |
| 7,280,082 B2 | 10/2007 | Theobold et al. | |
| 7,286,436 B2 | 10/2007 | Bhakta et al. | |
| 7,324,060 B2 | 1/2008 | Quan et al. | |
| 7,327,315 B2 | 2/2008 | Starkie et al. | |
| 7,334,028 B2 | 2/2008 | Flocken | |
| 7,337,333 B2 | 2/2008 | O'Conner et al. | |
| 7,340,763 B1 | 3/2008 | Harris | |
| 7,359,208 B2 | 4/2008 | Ni | |
| 7,372,695 B2 | 5/2008 | Coglitore et al. | |
| 7,377,603 B2 | 5/2008 | Quijano | |
| 7,377,804 B2 | 5/2008 | Lin | |
| 7,396,257 B2 | 7/2008 | Takahashi | |
| 7,403,169 B2 | 7/2008 | Svensson et al. | |
| 7,408,772 B2 | 8/2008 | Grady et al. | |
| 7,414,312 B2 | 8/2008 | Nguyen et al. | |
| 7,414,837 B2 | 8/2008 | Su | |
| 7,429,781 B2 | 9/2008 | Wallace | |
| 7,436,674 B2 | 10/2008 | Barsun et al. | |
| 7,443,350 B2 | 10/2008 | Gaucher et al. | |
| 7,450,077 B2 | 11/2008 | Waterhouse et al. | |
| 7,466,880 B2 | 12/2008 | Windover | |
| 7,498,995 B2 | 3/2009 | Kim et al. | |
| 7,508,663 B2 | 3/2009 | Coglitore | |
| 7,511,681 B2 | 3/2009 | Bolin | |
| 7,522,943 B2 * | 4/2009 | Hutchison | H04M 1/22 455/90.3 |

(56) References Cited

U.S. PATENT DOCUMENTS

| | | |
|---|---|---|
| 7,525,219 B2 | 4/2009 | Campini et al. |
| 7,538,739 B2 | 5/2009 | Tao |
| 7,539,023 B2 | 5/2009 | Bulcea |
| 7,539,219 B2 | 5/2009 | Kwong et al. |
| 7,551,140 B2 | 6/2009 | Knadle, Jr. et al. |
| 7,557,755 B2 | 7/2009 | Han et al. |
| 7,580,781 B2 | 8/2009 | Mindeman |
| 7,584,382 B2 | 9/2009 | Verbowski et al. |
| 7,613,937 B2 | 11/2009 | Boyum et al. |
| 7,619,683 B2 | 11/2009 | Davis |
| 7,619,881 B1 | 11/2009 | Granville et al. |
| 7,636,863 B2 | 12/2009 | Oh |
| 7,650,480 B2 | 1/2010 | Jiang |
| 7,656,658 B2 | 2/2010 | Liu et al. |
| 7,659,736 B2 | 2/2010 | Eldridge et al. |
| 7,683,460 B2 | 3/2010 | Heitzer et al. |
| 7,697,301 B2 | 4/2010 | Lee et al. |
| 7,705,783 B2 | 4/2010 | Rao et al. |
| 7,710,725 B2 | 5/2010 | Takakusaki et al. |
| 7,716,470 B2 | 5/2010 | Stillerman et al. |
| 7,719,832 B2 | 5/2010 | Kobara et al. |
| 7,733,635 B2 | 6/2010 | Sullivan |
| 7,764,236 B2 | 7/2010 | Hill et al. |
| 7,764,506 B2 | 7/2010 | Sullivan |
| 7,768,470 B2 | 8/2010 | Qin et al. |
| 7,777,684 B2 | 8/2010 | Rao et al. |
| 7,817,412 B2 | 10/2010 | Sullivan |
| 7,818,487 B2 | 10/2010 | Chu |
| 7,826,205 B2 | 11/2010 | Smith |
| 7,830,657 B2 | 11/2010 | Chu et al. |
| 7,833,051 B2 | 11/2010 | Huang et al. |
| 7,835,769 B2 | 11/2010 | Gustaf |
| 7,843,691 B2 | 11/2010 | Reichert et al. |
| 7,869,210 B2 | 1/2011 | Moss |
| 7,885,056 B2 | 2/2011 | Bopp |
| 7,894,703 B2 | 2/2011 | Lapstun et al. |
| 7,895,540 B2 | 2/2011 | Engin et al. |
| 7,903,407 B2 | 3/2011 | Matsushima et al. |
| 7,907,398 B2 | 3/2011 | Hrehor, Jr. et al. |
| 7,907,409 B2 | 3/2011 | Wyatt et al. |
| 7,926,977 B2 | 4/2011 | Nall et al. |
| 7,952,529 B2 | 5/2011 | Huang et al. |
| 7,975,109 B2 | 7/2011 | McWilliams et al. |
| 7,978,465 B2 | 7/2011 | Osaka et al. |
| 8,028,146 B2 | 9/2011 | Yamamoto |
| 8,047,780 B2 | 11/2011 | Chen et al. |
| 8,059,054 B2 | 11/2011 | Mohammadian et al. |
| 8,063,841 B2 | 11/2011 | Peng et al. |
| 8,068,340 B1 | 11/2011 | Nguyen et al. |
| 8,077,476 B2 | 12/2011 | Yasudo et al. |
| 8,081,122 B2 | 12/2011 | Kearney et al. |
| 8,102,319 B2 | 1/2012 | Schlub et al. |
| 8,107,569 B2 | 1/2012 | Chang |
| 8,120,904 B2 | 2/2012 | Morrison et al. |
| 8,123,495 B2 | 2/2012 | Di Foggia et al. |
| 8,131,830 B2 | 3/2012 | Gill et al. |
| 8,138,985 B2 | 3/2012 | Cooper |
| 8,144,068 B2 | 3/2012 | Thevenard et al. |
| 8,149,172 B2 | 4/2012 | Lu et al. |
| 8,164,888 B2 | 4/2012 | Ma et al. |
| 8,164,901 B2 | 4/2012 | Neudorfer |
| 8,190,837 B2 | 5/2012 | McLeod et al. |
| 8,191,837 B2 | 6/2012 | Chen et al. |
| 8,203,837 B2 | 6/2012 | Zeighami et al. |
| 8,208,381 B2 | 6/2012 | Kannan et al. |
| 8,212,921 B2 | 7/2012 | Yun |
| 8,226,488 B2 | 7/2012 | Chen et al. |
| 8,228,251 B1 | 7/2012 | Behdad et al. |
| 8,248,314 B2 | 8/2012 | Ash, Jr. et al. |
| 8,259,027 B2 | 9/2012 | Isom et al. |
| 8,270,157 B2 | 9/2012 | Hongo |
| 8,274,792 B2 | 9/2012 | Soffer |
| 8,278,745 B2 | 10/2012 | Coteus et al. |
| 8,305,754 B2 | 11/2012 | Wu et al. |
| 8,319,583 B2 | 11/2012 | Huettner |
| 8,321,645 B2 | 11/2012 | Rabii et al. |
| 8,323,041 B2 | 12/2012 | Gore et al. |
| 8,325,093 B2 | 12/2012 | Holland et al. |
| 8,327,110 B2 | 12/2012 | Yamamoto |
| 8,355,246 B2 | 1/2013 | Linhares, Jr. et al. |
| 8,405,969 B2 | 3/2013 | Sullivan |
| 8,434,804 B2 | 5/2013 | Slessman |
| 8,441,404 B2 | 5/2013 | Chiang et al. |
| 8,441,793 B2 | 5/2013 | Dunwoody et al. |
| 8,446,729 B2 | 5/2013 | Schuette |
| 8,520,385 B2 | 8/2013 | Chen |
| 8,526,182 B2 | 9/2013 | Chen et al. |
| 8,531,344 B2 | 9/2013 | Ayatollahi et al. |
| 8,535,103 B2 | 9/2013 | Lim et al. |
| 8,543,660 B2 | 9/2013 | Roberts et al. |
| 8,564,491 B2 | 10/2013 | Peng |
| 8,582,292 B1 | 11/2013 | Eichelberg |
| 8,582,298 B2 | 11/2013 | Facusse et al. |
| 8,582,306 B2 | 11/2013 | Hamand et al. |
| 8,605,434 B2 | 12/2013 | Chao |
| RE44,739 E | 1/2014 | Chu |
| 8,623,289 B2 | 1/2014 | Cesa et al. |
| 8,638,548 B2 | 1/2014 | Gardes |
| 8,656,579 B2 | 2/2014 | Wojack et al. |
| 8,687,377 B2 | 4/2014 | Harashima et al. |
| 8,736,782 B2 | 5/2014 | Chen et al. |
| 8,737,638 B2 | 5/2014 | Sakurada et al. |
| 8,783,051 B2 | 7/2014 | Kundapur |
| 8,786,513 B2 | 7/2014 | Liang et al. |
| 8,788,786 B2 | 7/2014 | Yamamoto |
| 8,837,132 B2 | 9/2014 | Lin et al. |
| 8,854,438 B2 | 10/2014 | Choi |
| 8,863,173 B2 | 10/2014 | Jing et al. |
| 8,881,204 B2 | 11/2014 | Ojala et al. |
| 8,907,855 B2 | 12/2014 | Chang |
| 8,954,821 B2 | 2/2015 | Bedeschi |
| 8,976,513 B2 | 3/2015 | Sullivan |
| 9,000,996 B2 | 4/2015 | Holland et al. |
| 9,048,112 B2 | 6/2015 | Pan et al. |
| 9,065,673 B2 | 6/2015 | Diab et al. |
| 9,066,316 B2 | 6/2015 | Secades et al. |
| 9,069,666 B2 | 6/2015 | Hawkins et al. |
| 9,088,820 B2 | 7/2015 | Yu et al. |
| 9,091,386 B2 | 7/2015 | Bentz et al. |
| 9,116,893 B2 | 8/2015 | Welsh et al. |
| 9,119,316 B2 | 8/2015 | Lee |
| 9,142,889 B2 | 9/2015 | Pazin et al. |
| 9,147,929 B2 | 9/2015 | Anguera et al. |
| 9,189,091 B2 | 11/2015 | Koenig et al. |
| 9,225,761 B2 | 12/2015 | Ficco |
| 9,244,866 B2 | 1/2016 | Wee et al. |
| 9,258,609 B2 | 2/2016 | Ordyna et al. |
| 9,324,294 B2 | 4/2016 | Lin et al. |
| 9,390,035 B2 | 7/2016 | Hinkle et al. |
| 9,450,309 B2 | 9/2016 | Cooper |
| 9,478,867 B2 | 10/2016 | Cooper et al. |
| 9,478,868 B2 | 10/2016 | Henry et al. |
| 9,483,118 B2 | 11/2016 | Golyshko et al. |
| 9,535,625 B2 | 1/2017 | Raciborski et al. |
| 9,606,577 B2 | 3/2017 | Sullivan |
| 9,723,759 B2 | 8/2017 | Heydari et al. |
| 9,961,788 B2 | 5/2018 | Sullivan |
| 10,236,032 B2 | 3/2019 | Oh et al. |
| 10,285,293 B2 | 5/2019 | Sullivan |
| 10,849,245 B2 | 11/2020 | Sullivan |
| 2001/0048793 A1 | 12/2001 | Dair et al. |
| 2002/0050981 A1 | 5/2002 | Nuovo |
| 2002/0058445 A1 | 5/2002 | Tamura et al. |
| 2002/0086703 A1* | 7/2002 | Dimenstein .......... G06F 1/1632 455/557 |
| 2002/0097555 A1 | 7/2002 | Smith et al. |
| 2002/0099513 A1 | 7/2002 | Keezer |
| 2002/0101707 A1 | 8/2002 | Canova et al. |
| 2002/0126442 A1 | 9/2002 | Lim et al. |
| 2002/0140147 A1 | 10/2002 | Pols Sandhu et al. |
| 2002/0145847 A1 | 10/2002 | Crosby |
| 2002/0196228 A1 | 12/2002 | Hirayama et al. |
| 2003/0005073 A1 | 1/2003 | Yoshizawa et al. |
| 2003/0156383 A1 | 8/2003 | Jenkins et al. |

(56) References Cited

U.S. PATENT DOCUMENTS

| | | |
|---|---|---|
| 2003/0161101 A1 | 8/2003 | Hillyard et al. |
| 2003/0210521 A1 | 11/2003 | Rietze et al. |
| 2004/0017361 A1* | 1/2004 | Lieu .................. H04M 1/7246 345/169 |
| 2004/0049610 A1 | 3/2004 | Esterberg et al. |
| 2004/0054796 A1 | 3/2004 | Kikuchi et al. |
| 2004/0174675 A1 | 9/2004 | Liu |
| 2004/0193824 A1 | 9/2004 | Johnson |
| 2004/0214543 A1 | 10/2004 | Osone et al. |
| 2005/0007692 A1 | 1/2005 | Thompson et al. |
| 2005/0086413 A1 | 4/2005 | Lee et al. |
| 2005/0102451 A1 | 5/2005 | Pan et al. |
| 2005/0205292 A1 | 9/2005 | Rogers et al. |
| 2005/0237716 A1 | 10/2005 | Chu et al. |
| 2005/0280981 A1 | 12/2005 | Chen |
| 2006/0002070 A1 | 1/2006 | Jenkins et al. |
| 2006/0065431 A1 | 3/2006 | Trucco |
| 2006/0069896 A1 | 3/2006 | Sanders |
| 2006/0142910 A1 | 6/2006 | Grier et al. |
| 2006/0158844 A1 | 7/2006 | Lee |
| 2006/0256522 A1 | 11/2006 | Wei et al. |
| 2006/0256533 A1 | 11/2006 | Scigiel |
| 2007/0026945 A1 | 2/2007 | Nguyen |
| 2007/0094439 A1 | 4/2007 | Kumar et al. |
| 2007/0150480 A1 | 6/2007 | Hwang et al. |
| 2007/0170337 A1 | 7/2007 | Chang |
| 2007/0230101 A1 | 10/2007 | Wong et al. |
| 2007/0230110 A1 | 10/2007 | Starr et al. |
| 2008/0091858 A1 | 4/2008 | Zhang et al. |
| 2008/0165291 A1 | 7/2008 | Choi |
| 2008/0259060 A1 | 10/2008 | Lin et al. |
| 2009/0037949 A1 | 2/2009 | Birch |
| 2009/0132621 A1 | 5/2009 | Jensen et al. |
| 2009/0160733 A1 | 6/2009 | Chiba |
| 2009/0182533 A1 | 7/2009 | Neuenschwander et al. |
| 2009/0231232 A1 | 9/2009 | Chan |
| 2009/0251607 A1 | 10/2009 | Stoddart et al. |
| 2009/0255653 A1 | 10/2009 | Mills et al. |
| 2009/0292896 A1 | 11/2009 | Ando et al. |
| 2009/0320065 A1 | 12/2009 | Sloo et al. |
| 2010/0007293 A1 | 1/2010 | Meadors et al. |
| 2010/0033931 A1 | 2/2010 | Miyazawa et al. |
| 2010/0049914 A1 | 2/2010 | Goodwin |
| 2010/0110633 A1 | 5/2010 | Gigushinsky |
| 2010/0113092 A1 | 5/2010 | Mitchell |
| 2010/0115321 A1 | 5/2010 | Fujimoto et al. |
| 2010/0217909 A1 | 8/2010 | Pavol et al. |
| 2010/0306501 A1 | 12/2010 | Chang et al. |
| 2010/0321876 A1 | 12/2010 | Liu et al. |
| 2011/0013348 A1 | 1/2011 | Seibold et al. |
| 2011/0128199 A1 | 6/2011 | He et al. |
| 2011/0175787 A1 | 7/2011 | Malak et al. |
| 2011/0235755 A1 | 9/2011 | Yang et al. |
| 2011/0266163 A1 | 11/2011 | Mostowy |
| 2011/0302357 A1 | 12/2011 | Sullivan |
| 2011/0307746 A1 | 12/2011 | Sullivan et al. |
| 2012/0002455 A1 | 1/2012 | Sullivan et al. |
| 2012/0151098 A1 | 6/2012 | Sullivan |
| 2012/0173732 A1 | 7/2012 | Sullivan |
| 2012/0200469 A1 | 8/2012 | Cooper et al. |
| 2012/0203936 A1 | 8/2012 | Faerevaag |
| 2012/0206303 A1 | 8/2012 | Desclos et al. |
| 2013/0035050 A1 | 2/2013 | Gao et al. |
| 2013/0170129 A1 | 7/2013 | Sullivan |
| 2013/0187816 A1 | 7/2013 | Chung et al. |
| 2013/0264919 A1 | 10/2013 | Sullivan |
| 2013/0271905 A1 | 10/2013 | Sullivan |
| 2013/0303267 A1 | 11/2013 | Vasquez et al. |
| 2013/0308266 A1 | 11/2013 | Sullivan |
| 2014/0055315 A1 | 2/2014 | Cooper et al. |
| 2014/0118210 A1 | 5/2014 | Cooper et al. |
| 2014/0118211 A1 | 5/2014 | Cooper et al. |
| 2014/0250267 A1 | 9/2014 | Sullivan |
| 2014/0281987 A1 | 9/2014 | Sullivan |
| 2014/0306586 A1 | 10/2014 | Sullivan |
| 2014/0309019 A1 | 10/2014 | Tessmer et al. |
| 2014/0333497 A1 | 11/2014 | Cooper |
| 2014/0355206 A1 | 12/2014 | Sullivan |
| 2015/0222008 A1 | 8/2015 | Cooper |
| 2015/0254199 A1 | 9/2015 | Sullivan |
| 2015/0333394 A1 | 11/2015 | Nash et al. |
| 2015/0340768 A1 | 11/2015 | Rucker et al. |
| 2015/0349401 A1 | 12/2015 | Nash |
| 2016/0181690 A1 | 6/2016 | Cooper et al. |
| 2016/0190702 A1 | 6/2016 | Rucker et al. |
| 2016/0191693 A1 | 6/2016 | Zavala |
| 2016/0380359 A1 | 12/2016 | Cooper et al. |

FOREIGN PATENT DOCUMENTS

| | | |
|---|---|---|
| CA | 2244369 A1 | 1/1999 |
| CA | 2503791 A1 | 5/2004 |
| CA | 2503793 A1 | 5/2004 |
| CA | 2504222 A1 | 5/2004 |
| CA | 2862768 A1 | 7/2012 |
| CN | 1149735 A | 5/1997 |
| CN | 1297288 A | 5/2001 |
| CN | 1591362 A | 3/2005 |
| CN | 1729734 A | 2/2006 |
| CN | 1984533 A | 6/2007 |
| CN | 101351807 | 1/2009 |
| CN | 101566962 A | 10/2009 |
| DE | 19938837 A1 | 3/2001 |
| EP | 0852350 A2 | 7/1998 |
| EP | 0984359 A2 | 3/2000 |
| EP | 1026688 A2 | 8/2000 |
| EP | 1081579 A1 | 3/2001 |
| EP | 1102456 A2 | 5/2001 |
| EP | 2673834 A1 | 12/2013 |
| FR | 2785476 | 5/2000 |
| GB | 2343298 A | 5/2000 |
| IL | 125630 | 11/2002 |
| JP | S55151398 | 11/1980 |
| JP | 59005705 A | 1/1984 |
| JP | S60207398 | 10/1985 |
| JP | S6127268 | 2/1986 |
| JP | S61064197 | 4/1986 |
| JP | 4107717 | 4/1992 |
| JP | 4055169 | 5/1992 |
| JP | H04206284 | 7/1992 |
| JP | H05145208 | 6/1993 |
| JP | H05206678 | 8/1993 |
| JP | 5267873 | 10/1993 |
| JP | H0637416 | 2/1994 |
| JP | H06216706 | 8/1994 |
| JP | H06260361 | 9/1994 |
| JP | 8501165 | 2/1996 |
| JP | H08221154 | 8/1996 |
| JP | 08235076 | 9/1996 |
| JP | 3035252 | 12/1996 |
| JP | H09212255 | 8/1997 |
| JP | 10056673 | 2/1998 |
| JP | 3048044 | 5/1998 |
| JP | 10173349 | 6/1998 |
| JP | H10270879 | 10/1998 |
| JP | H10307637 A | 11/1998 |
| JP | 11065708 | 3/1999 |
| JP | 11068344 | 3/1999 |
| JP | 111143583 | 5/1999 |
| JP | H11154038 | 6/1999 |
| JP | H11154563 | 6/1999 |
| JP | H11355022 | 12/1999 |
| JP | 2000076088 | 3/2000 |
| JP | 2000507053 | 6/2000 |
| JP | 2000232287 | 8/2000 |
| JP | 2000305652 | 11/2000 |
| JP | 2001068293 | 3/2001 |
| JP | 2001291970 | 10/2001 |
| JP | 2001320454 | 11/2001 |
| JP | 2002016684 | 1/2002 |
| JP | 2002026944 | 1/2002 |
| JP | 2002064283 | 2/2002 |
| JP | 2002099350 | 4/2002 |
| JP | 2002215337 | 8/2002 |

(56) References Cited

FOREIGN PATENT DOCUMENTS

| | | |
|---|---|---|
| JP | 2002258985 | 9/2002 |
| JP | 2002261458 | 9/2002 |
| JP | 2002298099 | 10/2002 |
| JP | 2002300257 | 10/2002 |
| JP | 2003100480 | 4/2003 |
| JP | 2004023798 | 9/2004 |
| JP | 2004252968 | 9/2004 |
| JP | 2005158068 | 6/2005 |
| JP | 2005190297 | 7/2005 |
| JP | 2006505874 | 2/2006 |
| JP | 2009064248 | 3/2009 |
| JP | 4333675 B2 | 9/2009 |
| JP | 2010277592 | 12/2010 |
| KR | 1020040072757 | 8/2004 |
| KR | 1020040080887 | 9/2004 |
| KR | 1020070062187 A | 6/2007 |
| KR | 1020080098147 | 11/2008 |
| KR | 1020130095451 A | 8/2013 |
| KR | 1020140089307 | 7/2014 |
| KR | 1020147023755 | 7/2014 |
| RU | 2066067 | 8/1996 |
| RU | 2084953 | 7/1997 |
| RU | 2211509 C2 | 8/2003 |
| RU | 2327263 C2 | 6/2008 |
| RU | 2380799 C1 | 1/2010 |
| RU | 2400876 C1 | 9/2010 |
| WO | WO 1995/14965 A1 | 6/1995 |
| WO | WO 1998/20578 A1 | 5/1998 |
| WO | WO 1999/57626 A2 | 11/1999 |
| WO | WO 2001/069359 A1 | 9/2001 |
| WO | WO 2002/007037 A1 | 1/2002 |
| WO | WO 2003/098732 A1 | 11/2003 |
| WO | WO 2004/038526 | 5/2004 |
| WO | WO 2004/038527 | 5/2004 |
| WO | WO 2004/038555 | 5/2004 |
| WO | WO 2007/036607 A1 | 4/2007 |
| WO | WO 2008/087195 A1 | 7/2008 |
| WO | WO 2011/040904 A1 | 4/2011 |
| WO | WO 2011/156277 A2 | 12/2011 |
| WO | WO 2011/156285 A2 | 12/2011 |
| WO | WO 2011/156404 A2 | 12/2011 |
| WO | WO 2011/156417 A2 | 12/2011 |
| WO | WO 2012/058753 A1 | 5/2012 |
| WO | WO 2012/094345 A2 | 7/2012 |
| WO | WO 2012/109392 A1 | 8/2012 |
| WO | WO 2012/109393 A1 | 8/2012 |
| WO | WO 2012/109498 A1 | 8/2012 |
| WO | WO 2013/049411 A1 | 4/2013 |
| WO | WO 2013/063335 A1 | 5/2013 |
| WO | WO 2013/071240 A1 | 5/2013 |
| WO | WO 2013/071241 A1 | 5/2013 |
| WO | WO 2014/011943 A1 | 1/2014 |
| WO | WO/2014/043401 A1 | 3/2014 |
| WO | WO/2014/047211 A1 | 3/2014 |
| WO | WO 2014/047567 A1 | 3/2014 |
| WO | WO 2014/107668 A1 | 7/2014 |
| WO | WO 2014/138448 A1 | 9/2014 |
| WO | WO 2014/138584 A1 | 9/2014 |
| WO | WO 2014/182848 A1 | 11/2014 |
| WO | WO 2015/103569 A1 | 7/2015 |
| WO | WO 2015/171963 A1 | 11/2015 |
| WO | WO 2015/175550 A1 | 11/2015 |
| WO | WO 2015/176064 A1 | 11/2015 |
| WO | WO 2015/184469 A2 | 12/2015 |
| WO | WO 2016/007958 A2 | 1/2016 |
| WO | WO 2016/011076 A1 | 1/2016 |
| WO | WO 2016/011181 A1 | 1/2016 |

OTHER PUBLICATIONS

Anonymous, "Discrete Logic vs. µController", Parallax Forums, XP055283104, Jun. 23, 2016, pp. 1-7, retrieved from http://forms.parallax.com/discussion//112097/discrete-logic-vs-controller.

Apple Computer, Inc., "Newton Apple MessagePad Handbook", 1995, 196 pages.

APT Technologies, Inc. et al., "Serial ATA: High Speed Serialized at Attachment", Jan. 7, 2003, pp. 1-2, retrieved from http://storusint.com/pdf/storage_protocols/sata/serialata10a.pdf.

Balanis, "Antenna Theory: A Review", Proc. IEEE, vol. 80, No. 1, Jan. 1992, pp. 7-23.

Kuzmenko, "The Device and the Main Connector Motherboard", Oct. 5, 2016, pp. 1-7, retrieved from http://www.chaynikam.info/stat_mainboard.html.

"Main board", Oct. 6, 2012, pp. 1-2, retrieved from http://www.chaynikam.info/stat_mainboard.html.

Minyard, C., "IPMI—A Gentle Introduction with Open IPMI", XP055165227, Software Montavista, Feb. 10, 2006, pp. 1-238, retrieved from http://operipmi.sourceforge.net/IPMI.pdf.

Page, M., "PaceBook Hybrid Tablet PC—Notebook", Website Title: PCSTATS News RSS, Oct. 5, 2014, 2 pages, retrieved from (http://www.pcstats.com/articleview.cfm?articleID=597).

Park et al., "Reliability and Performance Enhancement Technique for SSD Array Storage System Using RAID Mechanism", 9th International Symposium on Communications and Information Technology, Sep. 28-30, 2009, pp. 140-145.

Rybakiov, M.A., "Anatomy of Personal Computer," Intermechanics 1990, pp. 49-57, and 210.

Sievenpiper D., et al., "Low-Profile, Four-Sector Diversity Antenna on High-Impedance Ground Plane", Electronics Letters, IEE Stevenage, GB, vol. 36, No. 16, Aug. 3, 2000, pp. 1343-1345.

Tech Target, "Definition of Peripheral", Sep. 10, 2015, p. 1, retrieved from http://searchmobilecomputing.techtarget.com/definition/peripheral.

Wikipedia: The Free Encyclopedia, "MessagePad", Wikimedia Foundation, Dec. 16, 2014, pp. 2-9, retrieved from (http://en.wikipedia.org/wiki/MessagePad).

"Wireless Medium Access Control (MAC) and Physical Layer (PHY) Specifications for Wireless Personal Area Networks (WPANs)", The Institute of Electrical and Electronics Engineers, Inc., 802.15.1, Jun. 14, 2002, p. 1.

\* cited by examiner

SYSTEMS AND METHODS FOR PROVIDING A ROBUST COMPUTER PROCESSING UNIT

RELATED APPLICATIONS

This application is a continuation of U.S. patent application Ser. No. 16/404,576, which was filed on May 6, 2019 and entitled SYSTEMS AND METHODS FOR PROVIDING A ROBUST COMPUTER PROCESSING UNIT, which is a continuation of U.S. patent application Ser. No. 14/642,644, which was filed on Mar. 9, 2015 and entitled SYSTEMS AND METHODS FOR PROVIDING A ROBUST COMPUTER PROCESSING UNIT, now U.S. Pat. No. 10,285,293, which is a continuation of U.S. patent application Ser. No. 12/795,439, which was filed on Jun. 7, 2010 and entitled SYSTEMS AND METHODS FOR PROVIDING A ROBUST COMPUTER PROCESSING UNIT, now U.S. Pat. No. 8,976,513, which is a continuation of U.S. patent application Ser. No. 11/827,360, which was filed on Jul. 9, 2007 and entitled SYSTEMS AND METHODS FOR PROVIDING A ROBUST COMPUTER PROCESSING UNIT, now U.S. Pat. No. 7,733,635, which is a continuation of U.S. patent application Ser. No. 10/692,005, which was filed on Oct. 22, 2003 and entitled ROBUST CUSTOMIZABLE COMPUTER PROCESSING SYSTEM, now U.S. Pat. No. 7,242,574, which claims priority to U.S. Provisional Patent Application Ser. No. 60/455,789, filed Mar. 19, 2003, entitled, SYSTEMS AND METHODS FOR PROVIDING A DURABLE AND DYNAMICALLY MODULAR PROCESSING UNIT, and also claims priority to U.S. Provisional Patent Application Ser. No. 60/420,127, filed Oct. 22, 2002, entitled, NON-PERIPHERALS PROCESSING CONTROL UNIT HAVING IMPROVED HEAT DISSIPATING PROPERTIES, which are all expressly incorporated herein by reference in their entireties.

BACKGROUND

Field of the Invention

The present invention relates to computer processors and processing systems, computer housings, and computer encasement modules. In particular, the present invention relates to a non-peripherals-based computer processor and processing system configured within a proprietary encasement module and having a proprietary electrical printed circuit board configuration and other electrical components existing in a proprietary design. Still further, the present invention relates to a robust customizable computer processing unit and system designed to introduce intelligence into various structures, devices, systems, and other items said items, as well as to provide unique computer operating environments.

Background of the Invention and Related Art

As one of the most influential technologies in either the modern or historical world, computers and computer systems have significantly altered the way we conduct and live our lives, and have accelerated technological advancement to an exponential growth pace. Indeed, computers and computing systems play an indispensable role in driving invention, enabling lightning speed technological advancement, simplifying tasks, recording and storing data, connecting the world, as well as numerous other applications in virtually every industry and every country around the world. Indeed, the computer has become an indispensable tool for individuals, businesses, and governments alike. Since its inception, the computer and computing systems have undergone significant evolutionary changes. The small, powerful modern systems in use today are virtually incomparable to their ancestral counterparts of yesteryear.

Although the evolution of the processing capabilities of computers and computing systems reveals an exponential growth pattern, the physical and structural characteristics of these systems, namely the cases or encasement modules housing such electrical components as the processing (printed circuit boards, mother boards, etc.) and the peripheral components (hard drives, CD/DVD-ROM drives, sound cards, video cards, etc.) has unfortunately been limited to marginal improvement, with design considerations dictated by needed functionality, workability, and various component inclusion and associated design constraints. Computers and computing systems of today have not been able to shed the large, bulky encasement modules that support the processing and other components.

Conventional computer systems and their encasement modules, namely desktops, servers, and other similar computers or computing systems, while very functional and very useful, are large and bulky due to several reasons, one being that they are designed to comprise all of the components and peripheral devices necessary to operate the computer system, except the various external devices such as a monitor, a keyboard, a mouse, and the like. Indeed, partly to blame for the proliferation and slow evolution of the large and bulky computer encasement module is the perceived convenience of bundling both processing components and peripheral components within a neat, easy-to-use, single package. Such encasement modules have a rather large footprint, are heavy, and do not lend themselves to mobility or environmental adaptability. However, little has been done to move away from this and such systems are commonplace and accepted. For example, server systems are typically found within some type of area or space or room specifically designed to house the box-like structure; desktop computers occupy a significant amount of space of workstations, with their presence sometimes concealed within desks; or, some computers are left out in the open because there is nowhere else to place them.

While obviously there are a significant number of advantages and benefits, there are several problems or flaws, both inherent and created, associated with conventional computers and computing systems and the encasement modules comprising such. First, they are aesthetically displeasing as they take up space, require multiple cords, and generally look out of place with furniture and other décor. Second, they are noisy and produce or radiate large amounts of noise and heat when in operation as generated from the processing and peripheral components contained therein. Third, they provide fertile ground for dust, debris, insects, and various other foreign objects. Fourth, they are difficult to keep clean, particularly the internal components. Fifth, they produce a great deal of radiation in the form of electromagnetic interference. Sixth, they do not lend themselves to environmental or situational adaptability, meaning they are one-dimensional in function, namely to perform only computing functions. Seventh, they are not easily scalable, meaning that it is difficult to couple multiple computers together to achieve increased processing capabilities, especially without ample space or real estate. Eighth, the size and number of existing components require forced cooling systems, such as one or multiple fans, to dissipate heat from the interior of the system. Ninth, they comprise a peripheral-based system that requires all the peripherals to be operable simultaneously without giving the user the ability to interchange any one peripheral or all of the peripherals as desired. Tenth, while some peripheral devices may be interchangeable, some are not. These peripherals, such as the hard drive, are permanent, fixed structures.

Another significant disadvantage with conventional computers and computing systems is their inability to be easily adaptable to various environments or placed into existing systems, devices, etc. to enable a "smart" system. Conventional computers sit on the floor or in a desk and operate in a limited manner. In addition, conventional computers are not designed to be integrated within or as part of a structure or device to introduce intelligence into the structure or device. Still further, conventional computers do not possess any significant load bearing capabilities that allow them to serve as support members, nor do they lend themselves to providing customizable work station environments.

Lastly, the means for dissipating heat or means for cooling the components of conventional computers and computing systems presents several disadvantages. In almost all cases, heat dissipation or cooling is achieved by some type of forced cooling system. This typically means placing or mounting one or more blowers or fans within the interior and providing means for ventilating the circulated air, such as by forming slits within the walls of the encasement module. Indeed, most of the computer encasements currently in existence require the use of a forced cooling system to dissipate heat and to cool the interior of the computer where the processing components are located to preserve or maintain acceptable temperatures for component operation. Moreover, as most of the peripheral devices used are found within the interior, the encasement modules tend to be rather large, having a relatively large interior volume of space. As a result, the thermal discharge from the processing components is essentially trapped within this volume of space because there is no way for the air to escape. Therefore, various mechanical devices, such as blowers or fans, are incorporated into conventional encasement modules to circulate the air and dissipate heat from the interior to the outside air, which causes undesirable increase in temperature in the room where the computer is located.

Accordingly, what is needed is a robust computer and computer system that is capable of being customized to perform computing functions within a wide range of new and existing environments to provide increased adaptability, usability, and functionality within these environments.

SUMMARY AND OBJECTS OF THE INVENTION

In light of the deficiencies in conventional computers and computing systems discussed above, the present invention provides a new and novel computer and computing system that improves upon these designs. Particularly, the preferred exemplary embodiments of the present invention improve upon existing computers and computing systems and methods, and can, in some instances, be used to overcome one or more problems associated with or related to such existing systems and methods.

In accordance with the invention as embodied and broadly described herein, the present invention features a robust customizable computing system comprising: a processing control unit; an external object; and means for operably connecting the processing control unit to the external object, the processing control unit introducing intelligence into the external object, thus causing the external object to perform smart functions.

In a preferred embodiment, the processing control unit comprises: (a) an encasement module comprising a main support chassis having a plurality of wall supports and a plurality of junction centers containing means for supporting a computer component therein, a dynamic back plane that provides support for connecting peripheral and other computing components directly to a system bus without requiring an interface, means for enclosing the main support chassis and providing access to an interior portion of the encasement module; (b) one or more computer processing components disposed within the junction centers of the encasement module; and (c) means for cooling the interior portion of the encasement module.

As provided above, embodiments of the present invention are extremely versatile. As further examples, the processing control unit may be used to physically support and/or provide processing to various fixtures, devices, and/or inanimate objects, such a lighting fixture, an electrical outlet, a house appliance, or a breaker box. As provided herein, at least some embodiments of the present invention embrace a processing unit that functions as an engine that drives and controls the operation of a variety of components, structures, assemblies, equipment modules, etc. and enables smart functions within these.

Embodiments of the present invention embrace a platform that may be employed in association with all types of enterprise applications, particularly computer and/or electrical enterprises. The platform allows for a plurality of modifications that may be made with minimal impact to the processing control unit, thereby enhancing the usefulness of the platform across all types of applications and environments. Moreover, the processing control unit may function alone or may be associated with other similar processing control units in a robust customizable computing system to provide enhanced processing capabilities.

While the methods and processes of the present invention have proven to be particularly useful in the area of personal computing enterprises, those skilled in the art can appreciate that the methods and processes of the present invention can be used in a variety of different applications and in a variety of different areas of manufacture to yield robust customizable enterprises, including enterprises for any industry utilizing control systems or smart-interface systems and/or enterprises that benefit from the implementation of such devices. Examples of such industries include, but are not limited to, automotive industries, avionic industries, hydraulic control industries, auto/video control industries, telecommunications industries, medical industries, special application industries, and electronic consumer device industries. Accordingly, the systems and methods of the present invention provide massive computing power to markets, including markets that have traditionally been untapped by current computer techniques.

The present invention further features a method for introducing intelligence into an external object and enabling smart functions therein. The method comprises: obtaining an external object; operably connecting a processing control unit to the external object; and initiating one or more computing functions within the processing control unit to cause the external object to perform smart functions.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 15-B illustrates an exemplary robust customizable computing system in the form of a computer having snap-on peripherals;

DETAILED DESCRIPTION OF THE PREFERRED EMBODIMENTS

It will be readily understood that the components of the present invention, as generally described and illustrated in the figures herein, could be arranged and designed in a wide variety of different configurations. Thus, the following more detailed description of the embodiments of the system and method of the present invention, and represented in FIGS. 1 through 23, is not intended to limit the scope of the invention, as claimed, but is merely representative of the presently preferred embodiments of the invention.

The presently preferred embodiments of the invention will be best understood by reference to the drawings wherein like parts are designated by like numerals throughout.

In order to clearly present the concepts and features of the present invention, the specific features and characteristics of the present invention will be provided for and described below in two primary sections of discussion. The first description section and area of discussion focuses on and provides for the specific physical characteristics, features, functions, abilities, and advantages of the processing control unit, including the proprietary encasement module or housing adapted to embody the components of the processing control unit. The second description section and area of discussion focuses on the ability for the processing control unit to be customized and operably connected to any appropriate external object, either individually or to create a robust customizable computing system that may be applicable in any enterprise application. Specifically, the following description is divided into two sections, the first entitled, "Processing Control Unit" and the second entitled, "Robust Customizable Computing System." These sections are not to be construed as limiting in any way.

Processing Control Unit

With specific reference to FIGS. 1 and 2, the present invention features in one exemplary embodiment, and the figures illustrate, a proprietary non-peripherals or non-peripherals-based processing control unit 2 (hereinafter referred to as "processing control unit 2") shown in perspective view. In it simplest form, processing control unit 2 comprises a proprietary encasement module 10 (hereinafter referred to as "encasement module 10"), as well as a proprietary printed circuit board design (shown in FIG. 8). Processing control unit 2, through the specific and calculated design of encasement module 10, provides unparalleled computer processing advantages and features not found in prior art processing units or computers. Indeed, the present invention processing control unit as described and claimed herein presents a complete conceptual shift, or paradigm shift, from conventional computers or processing control units. This paradigm shift will become evident from the subject matter of the disclosure below, which subject matter is embodied in the appended claims.

Figure 1:
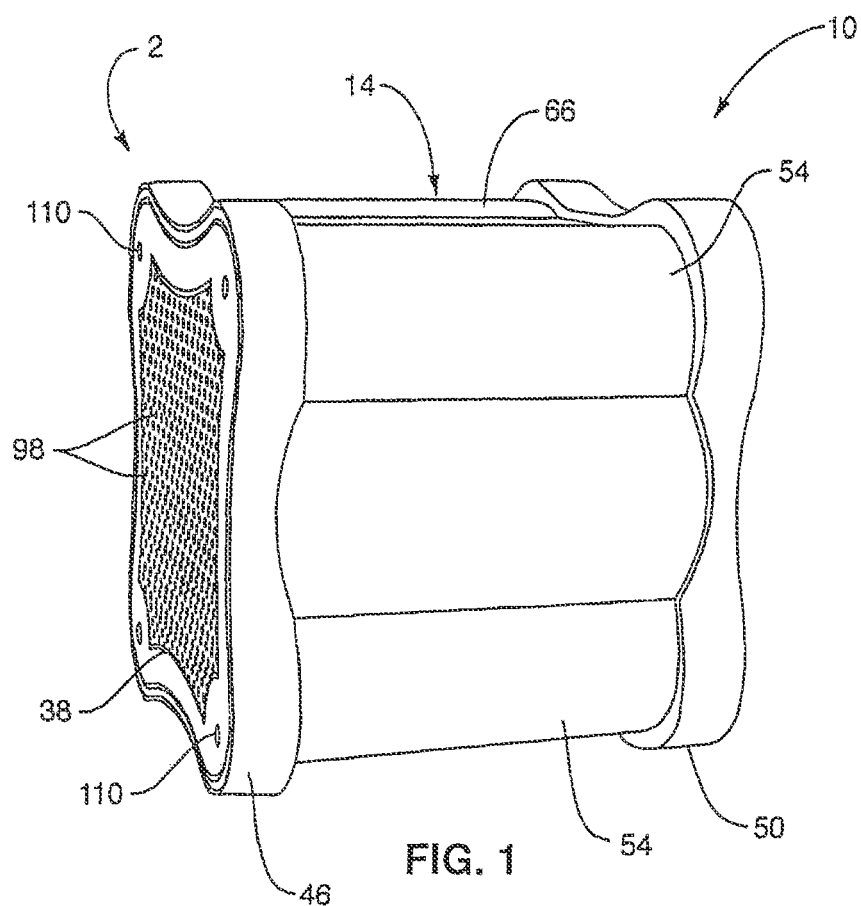
FIG. 1 illustrates a perspective view of the assembled non-peripherals computer encasement according to one embodiment of the present invention.
Figure 2:
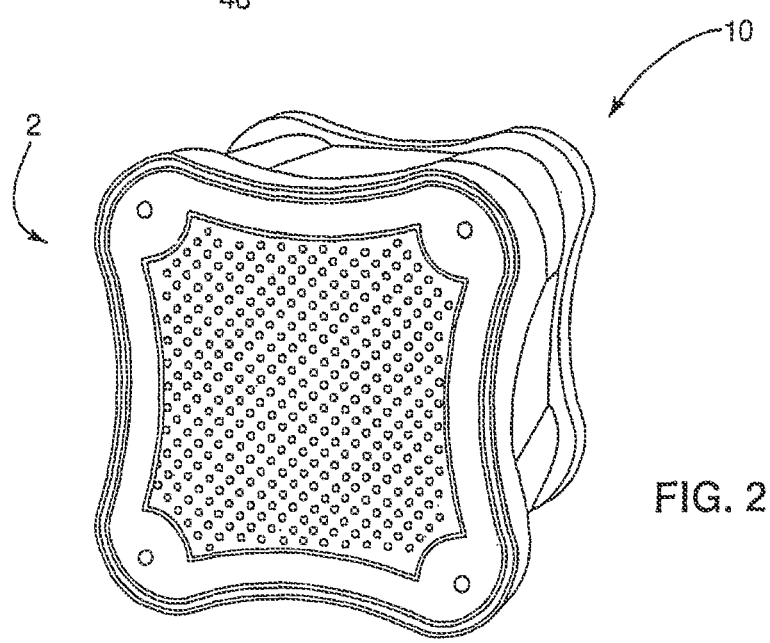
FIG. 2 illustrates another perspective view of the assembled non-peripherals computer encasement according to one embodiment of the present invention.

FIGS. 1 and 2 show processing control unit 2 in its fully assembled state with many of the primary components of processing control unit 2 generally illustrated. As stated, processing control unit 2 comprises encasement module 10, which itself has a very specific and unique support structure and geometric configuration or design that is more fully described in FIG. 3. In one exemplary, and preferred embodiment, encasement module 10 comprises a main support chassis 14; first insert 66; second insert 70; third insert 74 (not shown); dynamic back plane 34 (not shown); first end plate 38; second end plate 42 (not shown); first end cap 46; and second end cap 50 to provide an enclosed housing or encasement for one or more processing and other computer components, such as printed circuit boards, processing chips, and circuitry.

Figure 3:
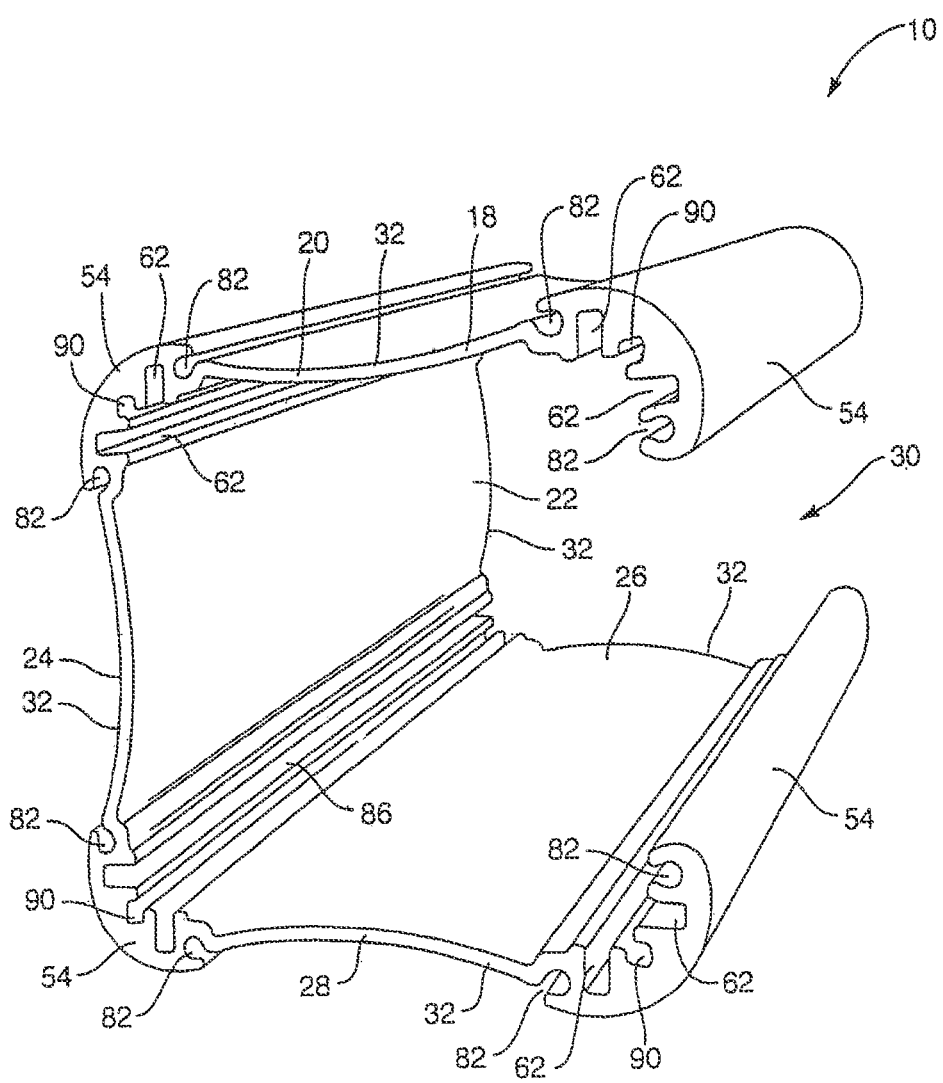
FIG. 3 illustrates a perspective view of an exemplary disassembled non-peripherals computer encasement, and particularly the main support chassis according to one embodiment of the present invention.
Figure 4:
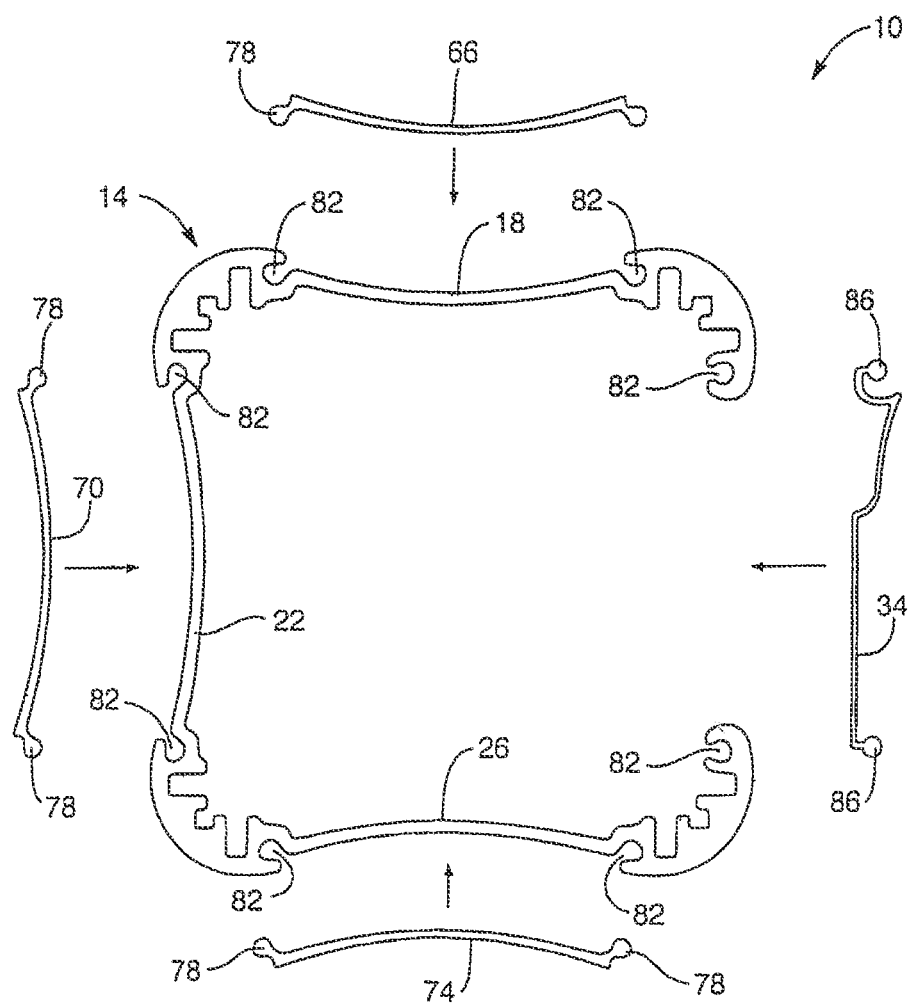
FIG. 4 illustrates an exploded side view of the main support chassis, as well as the inserts and back support or dynamic back plane according to one embodiment of the present invention.

FIGS. 3 and 4 illustrate an exemplary embodiment of main support chassis 14 and some of the component parts of encasement module 10 as designed to attach or couple to main support chassis 14. Preferably, these component parts are removably coupled to primary chassis 14, as shown, in order to enable some of the unique features and functions of processing control unit 2 as described and set forth herein. Main support chassis 14 serves as the primary support structure for encasement module 10 and processing control unit 2. Its small size and proprietary design provide advantages and benefits not found in prior art designs. Essentially, main support chassis 14 provides structural support for the component parts of processing control unit 2, including any additional physical attachments, processing and other circuit board components, as well as enabling processing control unit 2 to be adaptable to any type of environment, such as incorporation into any known structure or system, or to be used in clustered and multiplex environments.

Specifically, as shown in each of the figures, processing control unit 2, and particularly encasement module 10, is essentially comprised of a cube-shaped design, wherein first, second, and third wall supports 18, 22, and 26 of main support chassis 14, along with dynamic back plane 34 when attached, comprise the four sides of encasement module 10, with a union module 54 positioned at each corner of encasement module 10.

Junction center 54 functions to integrally join first, second, and third wall supports 18, 22, and 26, as well as to provide a base to which the end plates discussed below may be attached. End plates are coupled to main support chassis 14 using attachment means as inserted into attachment receipt 90, which is shown in FIG. 3 as an aperture, which may be threaded or not depending upon the particular type of attachment means used. Junction center 54 further provide the primary support and the junction center for the proprietary printed circuit board design existing within processing control unit 2 as discussed below. As shown in FIG. 3, printed circuit boards are capable of being inserted into and secured within one or more channeled board receivers 62. The particular design shown in the figures and described herein is merely an example of one embodiment or means for securing or engaging printed circuit boards within processing control unit 2. Other designs, assemblies, or devices are contemplated and may be used as recognized by one ordinarily skilled in the art. For instance, means for securing processing components may include screws, rivets, interference fits, and others commonly known.

Main support chassis 14 further comprises a plurality of slide receivers 82 designed to receive a corresponding insert located on one or more insert members, a dynamic back plane, or a mounting bracket of some sort used to couple two or more processing control units together, or to allow the processing control unit to be implemented into another structure, such as a Tempest superstructure. Slide receivers 82 may also be used to accept or receive suitable elements of a structure or a structure or device itself, wherein the processing control unit, and specifically the encasement module, serves as a load bearing member. The ability of processing control unit 2 to function as a load bearing member is derived from its unique chassis design. For example, processing control unit 2 may be used to bridge two structures together and to contribute to the overall structural support and stability of the structure. In addition, processing control unit 2 may bear a load attached directly to main support chassis 14. For example, a computer screen or monitor 170 may be physically supported and process controlled by processing control unit 2. As further examples, processing control unit 2 may be used to physically support and process control various home fixtures, such a lighting fixture, or a breaker box, etc. Moreover, if needed, an additional heat sink assembly may be coupled to processing control unit 2 in a similar manner. Many other possible load bearing situations or environments are possible and contemplated herein. Thus, those specifically recited herein are only meant to be illustrative and not limiting in any way. Slide receivers 82 are shown as substantially cylindrical channels running the length of the junction center 54 of main support chassis 14. Slide receivers 82 comprise merely one means of coupling external components to main support chassis 14. Other designs or assemblies are contemplated and may be used to carry out the intended function of providing means for attaching various component parts such as those described above as recognized by one ordinarily skilled in the art.

Figure 5:
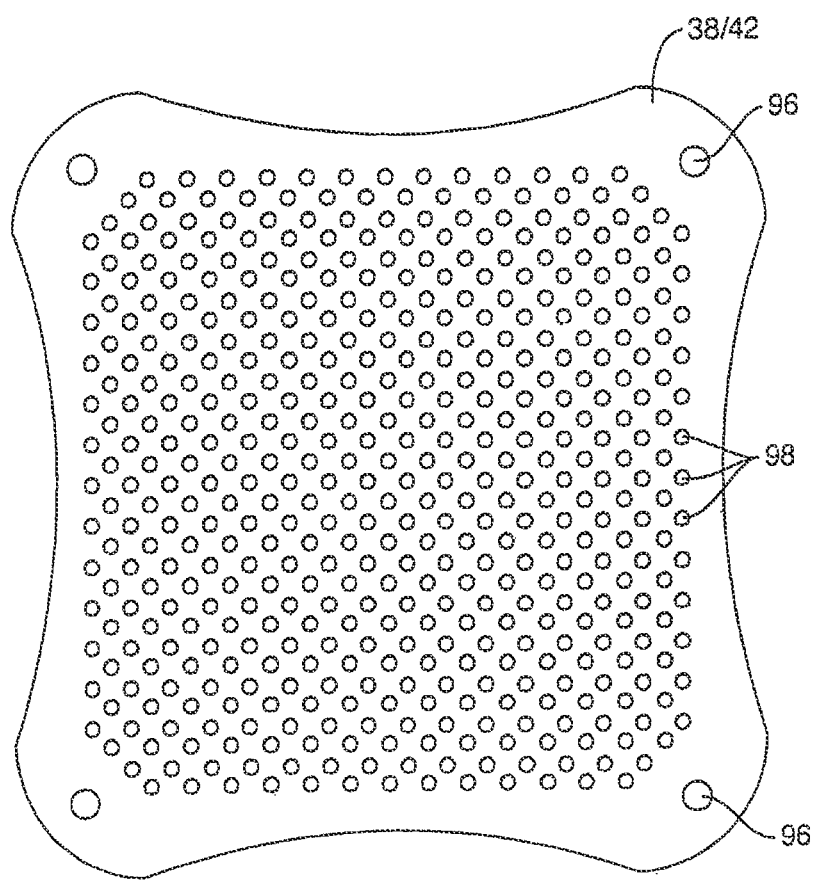
FIG. 5 illustrates an end plate as designed to be coupled to the ends of the main support chassis according to one embodiment of the present invention.
Figure 6:
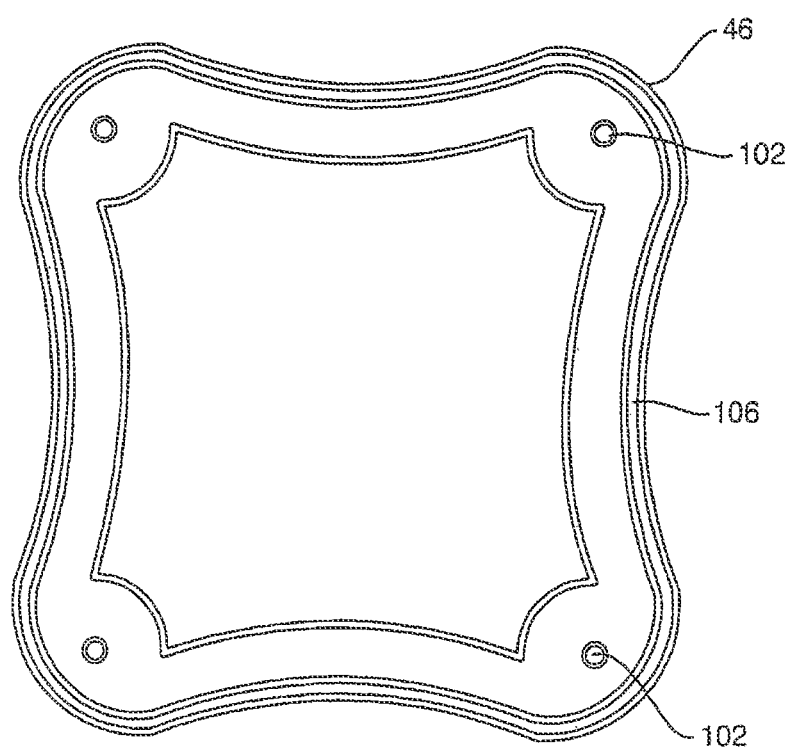
FIG. 6 illustrates an end cap designed to fit over and/or couple to an edge portion of the main support chassis according to one embodiment of the present invention.

FIGS. 3 and 4 further illustrate the concave nature of main support chassis 14, and particularly first, second, and third wall supports 18, 22, and 26. First, second, and third insert members 66, 70, and 74 comprise corresponding concave designs. Each of these component parts further comprise a specifically calculated radius of curvature, such that first wall support 18 comprises a radius of curvature 20 to correspond to a mating radius of curvature designed into first insert 66. Likewise, second wall support 22 comprises a radius of curvature 24 to correspond to a mating radius of curvature designed into second insert 70, and third wall support 26 comprises a radius of curvature 28 to correspond to a mating radius of curvature designed into third insert 74. End plates 38 and 42, as well as end caps 46 and 50, as illustrated in FIGS. 5 and 6, each comprise similar design profiles to match the concave design profile of main support chassis 14. In the embodiment shown in the figures, the wall supports comprise a radius of curvature of approximately 2.8 inches, and insert members comprise a radius of curvature of approximately 2.7 inches. The concaved design and the calculated radius' of curvature each contribute to overall structural rigidity and strength of main support chassis 14, as well as contributing to the thermodynamic heat dissipating properties of processing control unit 2. For example in a natural convection cooling system, described in greater detail below, the concaved design facilitates the distribution of heated air to the outer, and primarily upper, corners of encasement module 10, thus allowing heat or heated air to be dispersed away from the top and center of the interior portion of processing control unit 2 and towards the upper right and left corners, where it may then escape thru ventilation ports 98 or where it may be further conducted through the top of encasement module 10. Other embodiments are contemplated where the radius' of curvature of these elements may differ from one another to provide the most optimal design of encasement module 10 as needed.

In a preferred embodiment, main support chassis 14 comprises a full metal chassis that is structured and designed to provide an extremely strong support structure for processing control unit 2 and the components contained therein. Under normal circumstances, and even extreme circumstances, main support chassis 14 is capable of withstanding very large applied and impact forces originating from various external sources, such as those that would normally cause disfiguration or denting to prior related computer encasements, or limit their ability to be used in other or extreme environments. Essentially, main support chassis 14 is the main contributor to providing a virtually indestructible computer encasement for processing control unit 2. This unique feature in a computer encasement is in direct relation to the particular design of the components used to construct encasement module 10, including their geometric design, the way they are fit together, their material composition, and other factors, such as material thickness. Specifically, encasement module 10 is preferably built entirely out of radiuses, wherein almost every feature and element present comprises a radius. This principle of radiuses is utilized to function so that any load applied to processing control unit 2 is transferred to the outer edges of processing control unit 2. Therefore, if a load or pressure is applied to the top of encasement module 10, that load would be transferred along the sides, into the top and base, and eventually into the corners of encasement module 10. Essentially, any load applied is transferred to the corners of processing control unit 2, where the greatest strength is concentrated.

Processing control unit 2 and its components, namely encasement module 10, main support chassis 14, inserts 66, 70, and 74, dynamic back plane 34, and end plates 38 and 42, are each preferably manufactured of metal using an extrusion process. In one exemplary embodiment, main support chassis 14, first, second, and third inserts 66, 70, and 74, dynamic back plane 34, and first and second end plates 38 and 42 are made of high-grade aluminum to provide strong, yet light-weight characteristics to encasement module 10. In addition, using a metal casing provides good heat conducting properties. Although preferably constructed of aluminum or various grades of aluminum and/or aluminum composites, it is contemplated that various other materials, such as titanium, copper, magnesium, the newly achieved hybrid metal alloys, steel, and other metals and metal alloys, as well as plastics, graphites, composites, nylon, or a combination of these depending upon the particular needs and/or desires of the user, may be used to construct the main components of encasement module 10. In essence, the intended environment for or use of the processing control unit will largely dictate the particular material composition of its constructed components. As stated, an important feature of the present invention is the ability of the processing control unit to adapt and be used for several uses and within several different and/or extreme environments. As such, the specific design of the processing control unit relies upon a concerted effort to utilize the proper material. Stated differently, the processing control unit of the present invention contemplates using and comprises a pre-determined and specifically identified material composition that would best serve its needs in light of its intended use. For example, in a liquid cooled model or design, a more dense metal, such as titanium, may be used to provide greater insulative properties to the processing control unit.

Given its preferred aluminum composition, encasement module 10 is very strong, light-weight, and easy to move around, thus providing significant benefits extending to both the end user and the manufacturer. For example, from an end user standpoint, processing control unit 2 may be adapted for use within various environments in which prior related computers could not be found. In addition, an end user may essentially hide, mask, or camouflage processing control unit 2 to provide a more clean looking, less-cluttered room, or to provide a more aesthetically appealing workstation.

From a manufacturing standpoint, encasement module 10 and processing control unit 2 are capable of being manufactured using one or more automated assembly processes, such as an automated aluminum extrusion process-coupled with an automated robotics process for installing or assembling each of the component parts as identified above. Equally advantageous is the ability for encasement module 10 to be quickly mass-produced as a result of its applicability to an extrusion and robotics assembly process. Of course, processing control unit 2 may also be manufactured using other known methods, such as die casting and injection molding, hand assembly depending upon the particular characteristics desired and the particular intended use of the processing control unit.

In addition, since encasement module 10 is small in size and relatively light-weight, shipping costs, as well as manufacturing costs, are also greatly reduced.

With reference to FIG. 4, shown are the main components of encasement module 10, namely main support chassis 14 and the several inserts that are designed to removably attach or couple to the sides of main support chassis 14. FIG. 4 also illustrates dynamic back plane 34 as it is designed to removably attach or couple to the rear portion of main support chassis 14.

Specifically, first insert 66 attaches to first wall support 18. Second insert 70 attaches to second wall support 22. Third insert 74 attaches to third wall support 26. Moreover, each of first, second, and third inserts 66, 70, and 74, and first, second, and third wall supports 18, 22, and 26 comprise substantially the same radius of curvature so that they may mate or fit together in a nesting or matching relationship.

Each of first, second and third inserts 66, 70, and 74 comprise means for coupling main support chassis 14. In one exemplary embodiment, as shown in FIG. 4, each insert comprises two insert engagement members 78 located at opposing ends of the insert. Engagement members 78 are designed to fit within a means for engaging or coupling various external devices, systems, objects, etc. (hereinafter an external object) formed within main support chassis 14. In the exemplary embodiment shown, means for engaging an external object comprises a plurality of slide receivers 82 positioned along main support chassis 14 as shown and identified above in FIG. 3. Other means are also contemplated, such as utilizing various attachments ranging from snaps, screws, rivets, interlocking systems, and any others commonly known in the art.

Dynamic back plane 34 is also designed for or is capable of releasably coupling main support chassis 14. Dynamic back plane 34 comprises means for engaging main support chassis 14. In the exemplary embodiment shown, means for engaging is comprised of two engagement members 86 positioned at opposing ends of dynamic back plane 34. Engagement members 86 fit within slide receivers 82 at their respective locations along the rear portion of main support chassis 14 (shown as space 30) to removably attach dynamic back plane 34 to main support chassis 14, much the same way inserts 66, 70, and 74 attach to main support chassis 14 at their respective locations. These particular features are intended as one of several possible configurations, designs, or assemblies. Therefore, it is intended that one skilled in the art will recognize other means available for attaching dynamic back plane 34 to main support chassis 14 other than those specifically shown in the figures and described herein.

Means for engaging an external object, and particularly slide receiver 82, is capable of releasably coupling various types of external objects (as will be more fully described below), such as inserts 66, 70, and 74, dynamic back plane 34, mounting brackets, another processing control unit, or any other needed device, structure, or assembly. As illustrated in FIG. 4, slide receivers 82 engage corresponding engagement members 78 in a releasable manner so as to allow each insert to slide in and out as needed. As stated, other means for coupling main support chassis 14 and means for engaging an external object are contemplated herein, and will be apparent to one skilled in the art.

By allowing each insert and dynamic back plane 34 to be removably or releasably coupled to main support chassis 14, several significant advantages to processing control unit 2, over prior related computer encasements, are achieved. For example, and not intended to be limiting in any way, first, second, and third inserts 66, 70, and 74 may be removed, replaced, or interchanged for aesthetic purposes. These insert members may possess different colors and/or textures, thus allowing processing control unit 2 to be customized to fit a particular taste or to be more adaptable to a given environment or setting. Moreover, greater versatility is achieved by allowing each end user to specify the look and overall feel of their particular unit. Removable or interchangeable insert members also provide the ability to brand (e.g., with logos and trademarks) processing control unit 2 for any company entity or individual using the unit. Since they are external to main support chassis 14, the insert members will be able to take on any form or branding as needed.

Aside from aesthetics, other advantages are also recognized. On a higher level of versatility, means for engaging an external object provides processing control unit 2 with the ability to be robust and customizable to create a smart object. For instance, processing control unit may be docked in a mobile setting or in a proprietary docking station where it may serve as the control unit for any conceivable object, such as boats, cars, planes, and other items or devices that were heretofore unable to comprise a processing control unit, or where it was difficult or impractical to do so.

With reference to FIG. 5, shown is an illustration of one of first end plate 38 or second end plate 42 that couple to first and second end portions 40 and 44 of primary chassis 14, respectively, and function to provide means for allowing air to flow or pass in and out of the interior of processing control unit 2. First and second end plates 38 and 42 function with first and second end caps 46 and 50 (shown in FIG. 6), respectively, to provide a protective and functional covering to encasement module 10. First and second end plates 38 and 42 attach to main support chassis 14, using attachment means 110 (as shown in FIG. 1). Attachment means 110 typically comprises various types of screws, rivets, and other fasteners as commonly known in the art, but may also comprise other systems or devices for attaching first and second end plates 38 and 42, along with first and second end caps 46 and 50, to main support chassis 14, as commonly known in the art. In an exemplary embodiment, attachment means 110 comprises a screw capable of fitting within the respective attachment receivers 90 located in union module 54 at the four corners of main support chassis 14 (attachment receivers 90 and union module 54 are illustrated in FIG. 3).

Structurally, first and second end plates 38 and 42 comprise a geometric shape and design to match that of end portions 40 and 44 of main support chassis 14. Specifically, as shown in FIG. 5, the perimeter profile of first and second end plates 38 and 42 comprises a series of concave edges, each having a radius of curvature to match those of the respective wall supports and dynamic back plane. Essentially, end plates 38 and 42 serve to close off the ends of encasement module 10 by conforming to the shape of encasement module 10, whatever that may be.

One of the primary functions of first and second end plates 38 and 42 is to provide means for facilitating or allowing the influx of air into and efflux of air out of encasement module 10. In an exemplary embodiment as shown in FIG. 5, such means comprises a plurality of apertures or ventilation ports 98 intermittently spaced along the surface or face of and extending through end plates 38 and 42. As explained in the thermodynamics section below, in one embodiment, computer processing center 2 utilizes natural convection to cool the processing components contained therein. By equipping end plates 38 and 42 with ventilation ports 98 ambient air is allowed to enter into the interior of processing control unit 2, while the heated air, as generated from the processors and other components located within the interior of processing control unit 2, is allowed to escape or flow from the interior to the outside environment. By natural physics, heated air rises and is forced out of encasement module 10 as cooler air is drawn into encasement module 10. This influx and efflux of ambient and heated air, respectively, allows processing control unit 2 to utilize a natural convection cooling system to cool the processors and other internal components functioning or operating within processing control unit 2. Ventilation ports 98 are preferably numerous, and span a majority of the surface area of end plates 38 and 42, and particularly the outer perimeter regions, thus enabling increased and efficient cooling of all internal components in an air-cooled model. Ventilation ports 98 are machined to exact specifications to optimize airflow and to constrict partial flow into encasement module 10. By constricting some flow, dust and other sediments or particles are prohibited from entering the interior of encasement module 10 where they can cause damage to and decreased performance of processing control unit 2. Indeed, ventilation ports 98 are sized to only allow air particles to flow therethrough.

Because encasement module 10 is preferably made of metal, the entire structure, or a portion of the structure, can be positively or negatively charged to prohibit dust and other particles or debris from being attracted to the encasement. Such an electrostatic charge also prevents the possibility of a static charge jumping across dust and other elements and damaging the main board. Providing an electrostatic charge is similar to ion filtering, only opposite. By negatively charging encasement module 10, all positively charged ions (i.e. dust, dirt, etc.) are repelled.

FIG. 6 illustrates first end cap 46 and second end cap 50, which are designed to fit over first and second end plates 38 and 42, respectively, as well as over a portion of each end portion 40 and 44 of main support chassis 14. These end caps are preferably made of some type of impact absorbing plastic or rubber, thus serving to provide a barrier of protection to processing control unit 2, as well as to add to its overall look and feel.

In one exemplary, yet preferred embodiment, processing control unit 2 comprises a rather small footprint or size relative to or as compared with conventional computer encasements. For example, in an exemplary embodiment, its geometric dimensions are approximately 3.6 inches in length, 3.6 inches in width, and 3.6 inches in height, which are much smaller than prior related conventional processing control units, such as desktop computers or even most portable computers or laptops. In addition to its reduced dimensional characteristics, processing control unit 2 comprises rather unique geometrical characteristics as well. FIGS. 1 and 2 illustrate this unique shape or geometry, most of which has been discussed above. These dimensional and geometrical characteristics are proprietary in form and each contribute to the specific, unique functional aspects and performance of processing control unit 2. They also provide or lend themselves to significant features and advantages not found in prior related processing control units. Stated differently, the proprietary design of processing control unit 2 as described and shown herein allows it to perform in ways and to operate in environments that are otherwise impossible for prior related conventional computer encasements and processing units.

It is important to describe that processing control unit 2 can take on any size and/or geometric shape. Although in the preferred embodiment processing control unit 2 is substantially cube-shaped having a 3.6×3.6×3.6 size, other sizes and shapes are intended to be within the scope of the present invention. Specifically, as recited herein, the processing control unit may be adapted for use in various structures or super structures, such as any conceivable by one ordinarily skilled in the art. In this sense, processing control unit 2 must be able to comprise a suitable size and structure to be able to take on the physical attributes of its intended environment. For example, if processing control unit is to be used within a thin hand-held device, it will be constructed having a thin profile physical design, thus deviating away from the cube-like shape of the preferred embodiment. As such, the various computer and processing components used within processing control unit 2 are also capable of associated sizes and shapes and designs.

As apparent from its size, processing control unit 2 comprises none of the peripheral components that are typically found in prior art computer encasements, such as a desktop personal computer or a laptop. Hence the phrase "non-peripherally-based." Indeed, processing control unit 2 comprises a proprietary non-peripheral design, with the term "peripheral" referring to any one of or all of the several types of existing components commonly known in the art and commonly housed within prior art computer encasements. Preferably, any peripheral devices are process coupled to processing control unit 2, but are not physically included in the makeup of the unit. Peripheral devices may be attached or coupled using the methods described herein, such as through a slide-on, or snap-on system. Obviously, however, if desired, processing control unit 2 may be designed to include any conventional peripheral devices as found in the prior art, such as a hard drive, a CD-ROM drive, memory storage devices, etc. The present invention, therefore, is not limited to a non-peripheral design.

Some of the most common types of peripheral devices or components are mass or media storage devices, such as hard disk drives, magnetic disk drives, magnetic cassette drives, and optical disk drives (e.g. hard drives, floppy disc drives, CD-ROM drives, DVD drives, Zip drives, etc.), video cards, sound cards, and internal modems. All these types of peripheral devices or components, although not actually physically supported by or physically present within encasement module 10 and processing control unit 2, are nonetheless still intended to be compatible, functional, and/or operational with processing control unit 2 as designed. It should be noted that these described devices are typically considered peripherals. However, these items may also be integrated or embedded into the printed circuit board design of processing control unit 2, wherein they do not comprise or are considered peripherals, but are instead part of the logic of the printed circuit board design of processing control unit 2.

Although preferably containing no internal peripheral devices as identified above, processing control unit 2 still preferably comprises a system bus as part of its internal architecture. The system bus is designed to function as commonly known in the art, and is configured to connect and make operable the various external components and peripheral devices that would otherwise be internal. The system bus also enables data to be exchanged between these components and the processing components of processing control unit 2.

The system bus may include one of a variety of bus structures including a memory bus or memory controller, a peripheral bus, or a local bus that uses any one of a variety of bus architectures. Typical components connected by the system bus include a processing system and memory. Other components may include one or more mass storage device interfaces, one or more input interfaces, one or more output interfaces, and/or one or more network interfaces.

Processing control unit 2, although designed or intended to outperform prior related computer systems, is designed to be at least as functional as these computer systems. Therefore, everything a user is capable of doing on a typical or commonly known computer system (e.g. a desktop computing system) can be done on the computer system of the present invention. From a practical standpoint, this means that no functions or operations are sacrificed, but many are gained. As such, to be able to accomplish this using the proprietary design described herein, processing control unit 2 must be able execute similar tasks as prior related computers or computer processors, as well as to be able to access or utilize those components required to perform such tasks.

To function as a computing unit, processing control unit 2 comprises the necessary means for connecting these various identified peripherals and other hardware components, even though they are preferably located without or are remotely located from encasement module 10. Therefore, the present invention processing control unit 2 comprises various connection means for providing the necessary link between each peripheral device and the processing components contained within processing control unit 2. For example, one or more mass storage device interfaces may be used to connect one or more mass storage devices to the system bus of processing control unit 2. The mass storage devices are peripheral to processing control unit 2, but allow it to retain large amounts of data. As stated above, examples of a mass storage device include hard disk drives, magnetic disk drives, tape drives and optical disk drives. A mass storage device may read from and/or write to a magnetic hard disk, a removable magnetic disk, a magnetic cassette, an optical disk, or another computer readable medium. Mass storage devices and their corresponding computer readable media provide nonvolatile storage of data and/or executable instructions that may include one or more program modules such as an operating system, one or more application programs, other program modules, or program data.

One or more input interfaces may also be employed to enable a user to enter data and/or instructions into processing control unit 2 through one or more corresponding input devices. Examples of such input devices include a keyboard and alternate input devices, such as a mouse, trackball, light pen, stylus, or other pointing device, a microphone, a joystick, a game pad, a satellite dish, a scanner, a camcorder, a digital camera, and the like. Similarly, examples of input interfaces that may be used to connect the input devices to the system bus include a serial port, a parallel port, a game port, a universal serial bus ("USB"), a firewire (IEEE 1394), or another interface.

One or more output interfaces may also be employed to connect one or more corresponding output devices to the system bus. Examples of output devices include a monitor or display screen, a speaker system, a printer, and the like. These particular output devices are also peripheral to (without) processing control unit 2. Examples of output interfaces include a video adapter, an audio adapter, a parallel port, and the like.

In another embodiment, any peripheral devices used are connected directly to the system bus without requiring an interface. This embodiment is fully described in co-pending U.S. patent application Ser. No. 10/692,005, filed Oct. 22, 2003, and entitled, "Systems and Methods for Providing a Dynamically Modular Processing Unit," which is incorporated by reference in its entirety herein.

Providing a non-peripherals computer system gives users many advantages over larger, peripheral packed computer units. Some of the advantages may be that the user is able to reduce the space required to accommodate the computer unit and system. Indeed, the present invention processing control unit may be set directly atop a desk, or may be hidden from view completely. The potential storage locations are endless. Processing control unit 2 may even be camouflaged within some type of desk-top piece, such as a clock, to hide it from view. Other features may include a relative reduction in noise and generated heat, or universal application to introduce intelligence or "smart" technology into various items, assemblies, or systems (external objects) so that the external objects are capable of performing one or more smart functions. These and other examples are apparent from the disclosure herein.

As described above, the present invention processing control unit 2 was designed to have certain mainstream components exterior to encasement module 10 for multiple reasons. First, because of its small size, yet powerful processing capabilities, processing control unit 2 may be implemented into various devices, systems, vehicles, or assemblies. to enhance these as needed. Common peripheral devices, such as special displays, keyboards, etc., can be used in the traditional computer workstation, but processing control unit 2 can also be without peripherals and customized to be the control unit for many items, systems, etc. In other words, processing control unit 2 may be used to introduce "smart" technology into any type of conceivable item of manufacture (external object), such that the external object may perform one or more smart functions. A "smart function" may be defined herein as any type of computer executed function capable of being carried out by the external object as a result of the external object being operably connected and/or physically coupled to a computing system, namely processing control unit.

Second, regarding cooling issues, most of the heat generated within the interior of a computer comes from two places—the computer processor and the hard drive. By removing the hard drive from the encasement module 10 and putting it within its own encasement exterior to processing control unit 2, better and more efficient cooling is achieved. By improving the cooling properties of the system, the lifespan or longevity of the processor itself is increased, thus increasing the lifespan and longevity of the entire computer processing system.

Third, processing control unit 2 preferably comprises an isolated power supply. By isolating the power supply from other peripherals more of the supplied voltage can be used just for processing versus using the same voltage to power the processor in addition to one or more peripheral components, such as a hard drive and/or a CD-ROM, existing within the system. In a workstation model, the peripheral components will exist without processing control unit 2 and will be preferably powered by the monitor power supply.

Fourth, preferably no lights or other indicators are employed to signify that processing control unit 2 is on or off or if there is any disk activity. Activity and power lights still may be used, but they are preferably located on the monitor or other peripheral housing device. This type of design is preferred as it is intended that the system be used in many applications where lights would not be seen or where they would be useless, or in applications where they would be destructive, such as dark rooms and other photosensitive environments. Obviously however, exterior lighting, such as that found on conventional computer systems to show power on or disk use, etc., may be implemented or incorporated into the actual processing control unit 2, if so desired.

Fifth, passive cooling systems, such as a natural convection system, may be used to dissipate heat from the processing control unit rather than requiring some type of mechanical or forced air system, such as a blower or fan. Of course, such forced air systems are also contemplated for use in some particular embodiments. It should be noted that these advantages are not all inclusive. Other features and advantages will be recognized by one skilled in the art.

Figure 7:
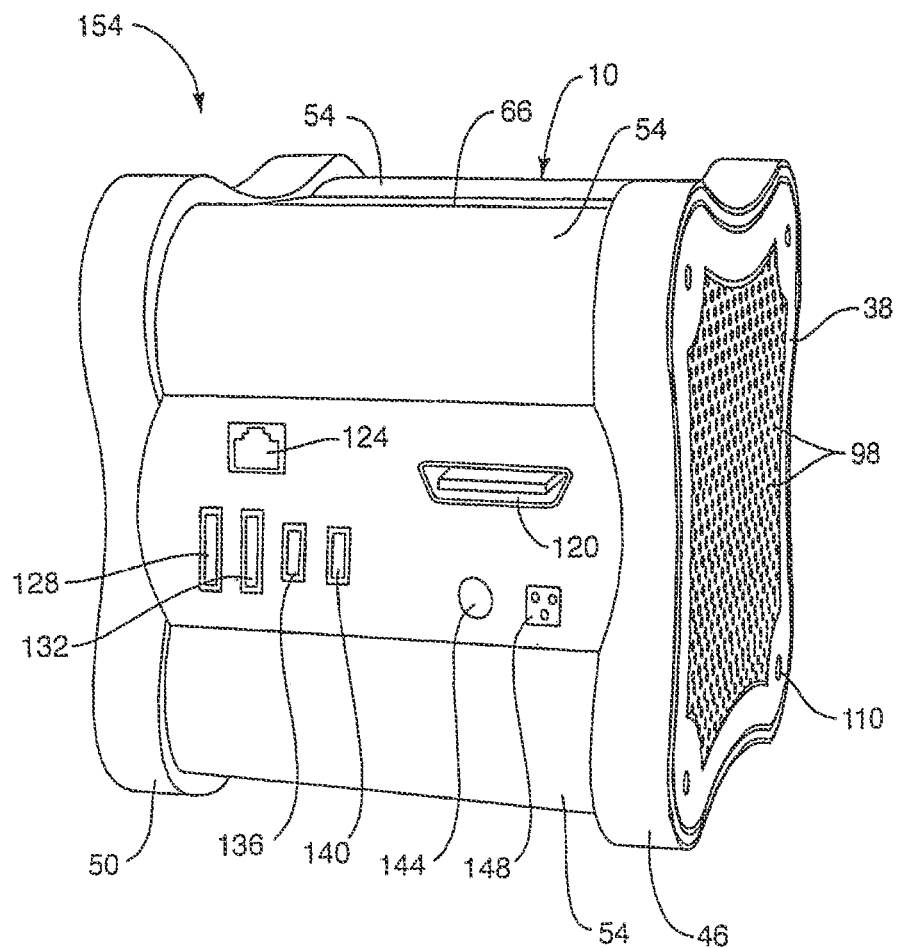
FIG. 7 illustrates an exemplary dynamic back plane having one or more input/output ports and a power port located thereon to couple various components to the non-peripheral computer.

With reference to FIG. 7, shown is processing control unit 2, and particularly encasement module 10, in an assembled state having first end plate 38 and second end plate 42 (not shown), first and second end caps 46 and 50, inserts 66, 70 (not shown), and 74 (not shown), as well as dynamic back plane 34 attached thereto. Dynamic back plane 34 is designed to comprise the necessary ports and associated means for connecting that are used for coupling various input/output devices and power cords to processing control unit 2 to enable it to function, especially in a workstation environment. While all the available types of ports are not specifically shown and described herein, it is intended that any existing ports, along with any other types of ports that come into existence in the future, or even ports that are proprietary in nature, are to be compatible with and capable of being designed into and functional with processing control unit 2. Preferably, this is accomplished by designing a different and interchanging back plane 34 as needed.

Specifically, dynamic back plane 34 comprises DVI Video port 120, 10/100 Ethernet port 124, USB ports 128 and 132, SATA bus ports 136 and 140, power button 144, and power port 148. A proprietary universal port is also contemplated that is used to electrically couple two processing control units together to increase the processing capabilities of the entire system and to provide scaled processing as identified and defined herein. One ordinarily skilled in the art will recognize the various ports that may be utilized with the processing control unit of the present invention.

The highly dynamic, customizable, and interchangeable back plane 34 provides support to peripherals and vertical applications. In the illustrated embodiment, back plane 34 is selectively coupled to encasement 10 and may include one or more features, interfaces, capabilities, logic and/or components that allow processing control unit 40 to be dynamically customizable. Dynamic back plane 34 may also include a mechanism that electrically couples two or more modular processing units together to increase the processing capabilities of the entire system as indicated above, and to provide scaled processing as will be further disclosed below.

Those skilled in the art will appreciate that back plane 34 with its corresponding features, interfaces, capabilities, logic and/or components are representative only and that embodiments of the present invention embrace back planes having a variety of different features, interfaces, capabilities and/or components. Accordingly, processing control unit 2 is dynamically customizable by allowing one back plane to be replaced by another back plane in order to allow a user to selectively modify the logic, features and/or capabilities of processing control unit 2.

Moreover, embodiments of the present invention embrace any number and/or type of logic and/or connectors to allow use of one or more modular processing control units in a variety of different environments. For example, some environments may include vehicles (e.g., cars, trucks, motorcycles, etc.), hydraulic control systems, structural, and other environments. The changing of data manipulating system(s) on the dynamic back plane allows for scaling vertically and/or horizontally for a variety of environments.

It should be noted that in an exemplary embodiment, the design and geometric shape of encasement module 10 provides a natural indentation for the interface of these ports. This indentation is shown in FIG. 7. Thus, inadvertent dropping or any other impacts to processing control unit 2, and encasement module 10, will not damage the system as these ports are protected via the indentation formed within the dynamic back plane. First and second end caps 46 and 50 also help to protect the system from damage.

Power button 144 has three states—system on, system off, and system standby for power boot. The first two states, system on and system off, dictate whether processing control unit 2 is powered on or powered off, respectively. The system standby state is an intermediary state. When power is turned on and received, the system is instructed to load and boot the operating system supported on processing control unit 2. When power is turned off, processing control unit 2 will then interrupt any ongoing processing and begin a quick shut down sequence followed by a standby state where the system sits inactive waiting for the power on state to be activated.

In this preferred embodiment, processing control unit 2 also comprises a unique system or assembly for powering up the system. The system is designed to become active when a power cord and corresponding clip is snapped into the appropriate port located on dynamic back plane 34. Once the power cord and corresponding clip is snapped into power port 148 the system will fire and begin to boot. The clip is important because once the power source is connected and even if the power cord is connected to the leads within power port 148, processing control unit 2 will not power on until the clip is snapped in place. Indicators may be provided, such as on the monitor, that warn or notify the user that the power cord is not fully snapped in or properly in place.

SATA bus ports 136 and 140 are designed to electronically couple and support storage medium peripheral components, such as CD-ROM drives, and hard drives.

USB ports 128 and 132 are designed to connect peripheral components like keyboards, mice, and any other peripheral components, such as 56 k modems, tablets, digital cameras, network cards, monitors, and others.

The present invention also contemplates snap-on peripherals that snap onto dynamic back plane and couple to the system bus of processing control unit 2 through a snap on connection system. As stated, other ports and means for connecting peripheral or input/output devices may be included and incorporated into processing control unit 2 as recognized by one skilled in the art. Therefore, the particular ports and means for connecting specifically identified and described herein are intended to be illustrative only and not limiting in any way.

Figure 8:
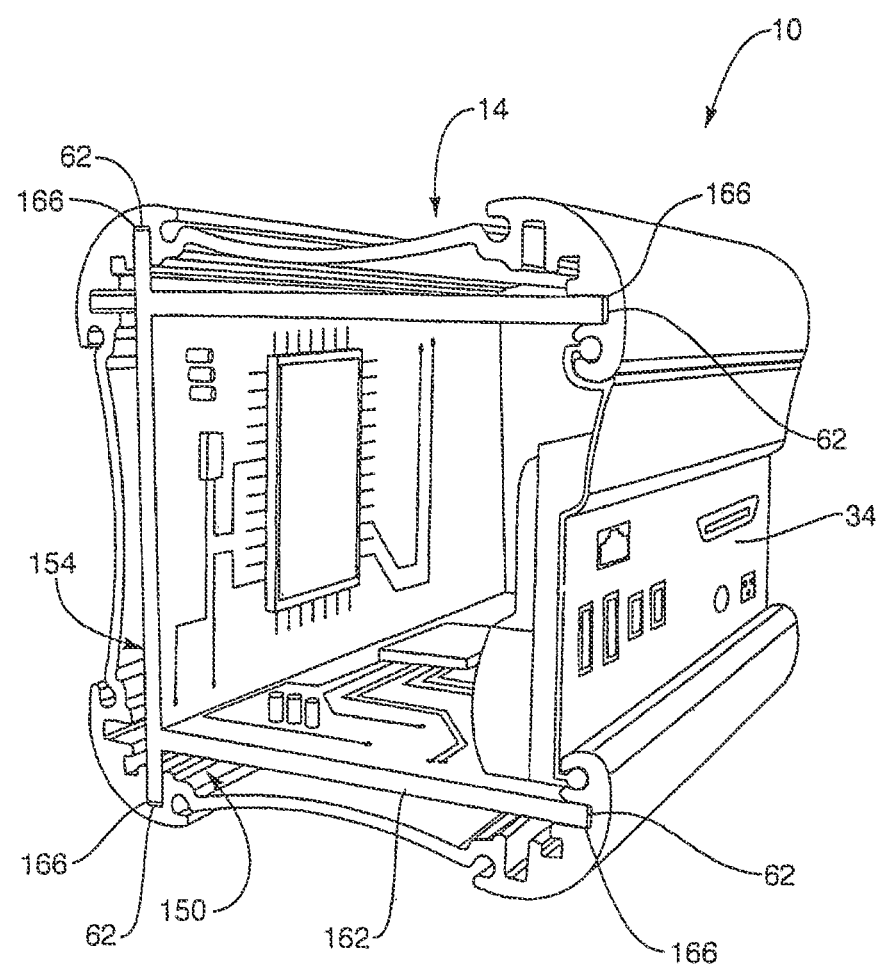
FIG. 8 illustrates an exemplary tri-computer circuit board configuration as coupled to or fit within the main support chassis of the non-peripherals computer encasement according to one embodiment of the present invention.

With reference to FIG. 8, the present invention processing control unit 2 comprises a proprietary computer processing system 150, with encasement module 10 comprising a unique design and structural configuration for housing processing system 150 and the electrical printed circuit boards designed to operate and be functional within processing control unit 2.

Essentially, processing system 150 includes one or more electrical printed circuit boards, and preferably three electrical printed circuit boards, oriented and formed in a tri-board configuration 152 as shown in FIG. 8. Processing system 150, and particularly tri-board configuration 152, comprises first electrical printed circuit board 154, second electrical printed circuit board 158, and third electrical printed circuit board 162 coupled to and housed within encasement module 10 as shown. Processing system 150 further comprises at least one central processor and optionally one or more other processors designed to perform one or more particular functions or tasks. Processing system 150 functions to execute the operations of processing control unit 2, and specifically to execute any instructions provided on a computer readable media, such as on a memory device, a magnetic hard disk, a removable magnetic disk, a magnetic cassette, an optical disk (e.g. hard drives, CD-ROM's, DVD's, floppy disks, etc.), or from a remote communications connection, which may also be viewed as a computer readable medium. Although these computer readable media are preferably located exterior to or without processing control unit 2, processing system 150 functions to control and execute instructions on such devices as commonly known, the only difference being that such execution is done remotely via one or more means for electrically connecting such peripheral components or input/output devices to processing control unit 2.

First, second, and third electrical printed circuit boards 154, 158, and 162 are supported within main support chassis 14 using means for engaging or coupling or supporting electrical printed circuit boards. In the embodiment shown in FIG. 8, means for engaging electrical printed circuit boards comprises a series of board receiving channels 62 located in each junction center of encasement module 10. Board receiving channels 62 are adapted to accept an end portion 166 of an electrical printed circuit board. Several orientations may exist for placing electrical printed circuit boards within encasement module 10, but preferably end portion 166 of first electrical printed circuit board 154 fits within board receiving channel 62 located adjacent first wall support 18. End portions 166 of second and third electrical printed circuit boards 158 and 162 fit in a similar manner within board receiving channel 62 located adjacent second and third wall supports 22 and 26, respectively, to comprise the orientation as shown in FIG. 8.

Tri-board main board configuration 152 and printed circuit boards are not supported by and preferably do not rest upon any of the wall supports of primary chassis 14. Each of the electrical printed circuit boards are specifically supported within primary chassis 14 by board receiving channels 62 located within junction centers. Primary chassis 14 is designed this way to provide a gap or space between each of the electrical printed circuit boards and the opposing wall supports to allow for the proper airflow within processing control unit 2 according to the unique natural convection cooling properties provided herein. As such, each radius of curvature calculated for each wall support is designed with this limitation in mind.

Tri board main board configuration 152 provides significant advantages over prior art board configurations. As one advantage, tri-board configuration 152 is configured in three multi-layer main boards instead of one main board as found in conventional computer systems. In addition, less real estate is taken up as the boards are able to be configured within different planes.

Another advantage is in the way two of the main boards couple to a third main board. By coupling each of the first, second, and third electrical printed circuit boards 154, 158, and 162 together in this manner, the chance for detachment of each of these boards from their proper place within primary chassis 14 and encasement module 10 is significantly decreased. In virtually any circumstance and condition processing control unit 2 is exposed to, tri-board configuration 152 will remain intact and in working order, thus maintaining or preserving the integrity of the system. This is true even in impact and applied loading situations.

Preferably, first and third electrical printed circuit boards 154 and 162 are attached to third electrical printed circuit board 158 during manufacture and prior to tri-board configuration 152 being placed within encasement module 10. Once tri-board configuration 152 is assembled it is inserted into and secured to main support chassis 14 as shown. It should be noted that not all of board receiving channels 62 are necessarily utilized.

FIG. 8 illustrates the preferred embodiment, wherein only four of these channels are used to support the respective end portions of the electrical printed circuit boards. However, FIG. 8 is only illustrative of a one exemplary embodiment. Other configurational designs for processing system 150 are contemplated. For example, processing control unit 2 could comprise one board only, or two or more boards. Moreover, processing system 150 may comprise a layered design configuration, in which the included printed circuit boards exist in a multi-planar configuration. One skilled in the art will recognize the several configurations and possibilities.

In addition to the many advantages discussed above, the present invention features other significant advantages, one of which is that due to encasement module 10 comprising a full metal chassis or a main support chassis 14, there is very little or no radiation emission in the form of electromagnetic interference (EMI). This is in large part due to the material properties, the small size, the thickness of the structure, and the close proximity of the processing components in relation to the structural components of encasement module 10. Whatever EMI is produced by the processing components is absorbed by encasement module 10, no matter the processing power of the processing components.

Another significant advantage is that encasement module 10 enables a much cleaner, more sterile interior than prior art computer encasement designs. Because of the design of encasement module 10, particularly the small size, ventilation ports, and the heat dissipating properties, it is very difficult for dust particles and other types of foreign objects to enter the encasement. This is especially true in a liquid cooled model, wherein the entire encasement may be sealed. A more sterile interior is important in that various types of foreign objects or debris can damage the components of and/or reduce the performance of processing control unit 2.

Although processing control unit 2 relies on natural convection in one exemplary embodiment, the natural influx and efflux of air during the natural convection process significantly reduces the influx of dust particles or other debris into processing control unit 2 because there is no forced influx of air. In the natural convection cooling system described herein, air particles enter the interior of encasement module 10 according to natural principles of physics, and are less apt to carry with them heavier foreign object as there is less force to do so. This is advantageous in environments that contain such heavier foreign objects as most environments do.

The unique cooling methodology of processing control unit 2 will allow it to be more adaptable to those environments prior related encasements were unable to be placed within.

Still another significant advantage of the present invention processing control unit 2 is its durability. Because of its compact design and radius-based structure, encasement module 10 is capable of withstanding large amounts of impact and applied forces, a feature which also contributes to the ability for processing control unit 2 to be adaptable to any type of conceivable environment. Encasement module 10 can withstand small and large impact forces with little effect to its structural integrity or electrical circuitry, an advantage that is important as the small size and portability of processing control unit 2 lends itself to many conceivable environments, some of which may be quite harsh.

In addition to the structural components of encasement module 10 being very durable, the electrical printed circuit design board and associated circuitry is also extremely durable. Once inserted, the printed circuit boards are very difficult to remove, especially as a result of inadvertent forces, such as dropping or impacting the encasement. Moreover, the boards are extremely light weight, thus not possessing enough mass to break during a fall. Obviously though, encasement 10 is not entirely indestructible. In most circumstances, encasement module 10 will be more durable than the board configurations, therefore the overall durability of processing control unit 2 is limited by the board configuration and the circuitry therein.

In short, encasement module 10 comprises a high level of durability not found in prior related encasement designs. Indeed, these would break, and often do, at very slight impact or applied forces. Such is not so with processing control unit 2 described herein.

The durability of encasement module 10 is derived from two primary features. First, encasement module 10 is preferably built with radiuses. Each structural component, and their designs, are comprised of one or more radiuses. This significantly adds to the strength of encasement module 10 as a radius-based structure provides one of the strongest designs available. Second, the preferred overall shape of encasement module 10 is cubical, thus providing significant rigidness. The radius-based structural components combined with the rigidness of the cubical design, provide a very durable, yet functional, encasement.

The durability of the individual processing units/cubes allows processing to take place in locations that were otherwise unthinkable with traditional techniques. For example, the processing units can be buried in the earth, located in water, buried in the sea, placed on the heads of drill bits that drive hundreds of feet into the earth, mounted on unstable surfaces, mounted to existing structures, placed in furniture, etc. The potential processing locations are endless.

The processing control unit of the present invention further features the ability to be mounted to, or to have mounted onto it, any structure, device, or assembly using means for mounting and means for engaging an external object (each preferably comprising slide receiver 82, as existing on each wall support of main support chassis 14). Any external object having the ability to engage processing control unit 2 in any manner so that the two are operably connected is contemplated for protection herein. In addition, one skilled in the art will recognize that encasement module 10 may comprise other designs or structures as means for engaging an external object other than slide receivers 82.

Essentially, the significance of providing mountability to processing control unit, no matter how this is achieved, is to be able to integrate processing control unit 2 into any type of environment as discussed herein, or to allow various items or objects (external objects) to be coupled or mounted to processing control unit 2. The unit is designed to be mounted to various inanimate items, such as multi-plex processing centers or transportation vehicles, as well as to receive various peripherals mounted directly to processing control unit 2, such as a monitor or LCD screen.

The mountability feature is designed to be a built-in feature, meaning that processing control unit 2 comprises means for engaging an external object built directly into its structural components. Both mounting using independent mounting brackets (e.g. those functioning as adaptors to complete a host-processing control unit connection), as well as mounting directly to a host (e.g. mounting the unit in a car in place of the car stereo) are also contemplated for protection herein.

Another capability of processing control unit 2 is its ability to be mounted and implemented within a super structure, such as a Tempest super structure, if additional hardening of the encasement module is effectuated. In such a configuration, processing control unit 2 is mounted within the structure as described herein, and functions to process control the components or peripheral components of the structure. Processing control unit 2 also functions as a load bearing member of the physical structure if necessary. All different types of super structures are contemplated herein, and can be made of any type of material, such as plastic, wooden, metal alloy, and/or composites of such.

Other advantages include a reduction in noise and heat and an ability to introduce customizable "smart" technology into various devices, such as furniture, fixtures, vehicles, structures, supports, appliances, equipment, personal items, etc. (external object). These concepts are discussed in detail below.

Robust Customizable Computing Systems

As hinted to above, the present invention processing control unit is unlike any other prior related computing processing system in that, because of its unique design and configuration, the processing control unit may be associated with, integrated into, or otherwise operably connected with an external object to introduce customizable "smart" technology into the external object, thus allowing the external object to perform many smart functions that it would otherwise not be able to perform. In addition, the robust customizable computing system may be applicable to various identified types of enterprise applications, such as computers and computing systems, electronics, home appliances, applications in various industries, etc. This section details the ability of the processing control unit described above to provide such robust customizable computing systems and their applicability in several exemplary enterprise applications.

The present invention features the ability for integrating, incorporating, or otherwise operably connecting a proprietary processing control unit into any conceivable system, device, assembly, apparatus, or object (collectively referred to as an "external object") to introduce intelligence into the external object or to perform one or more computing functions for the external object or to fulfill other functions with respect to the external object as recognized by those skilled in the art. By doing so, the item essentially becomes or is transformed into a "smart" item, meaning that the external object may perform many functions and tasks not hitherto possible. Specifically, through the operable connection of the processing control unit to an external object, the external object becomes capable of being much more functional than without a processing control unit present. For instance, if an electronic external object, the processing control unit can integrate with the circuitry, if any, of the electronic external object to provide added computing and processing power. If incorporating into a mechanical assembly or device or system, the addition of a processing control unit may allow the mechanics to be controlled by computer or more specifically controlled, or may allow several other computing functions to be possible. If incorporated into an existing structure, the addition of a processing control unit may allow the structure to perform computing functions not otherwise possible. Moreover, the processing control unit may serve as a support component to a structure, or support a load itself. Essentially, there is no limit to the types of functions that the external object may be caused to perform as a result of the processing control unit being operably connected thereto. However, such capabilities will be limited by the design and processing capabilities built into the processing control unit as will be recognized by one of ordinary skill in the art. This ability or capability to be operably connected with various external objects is a unique feature not found in conventional prior related computing devices and is made possible by the design, structure, and processing capabilities combination of processing control unit 2.

Incorporating or operably connecting a processing control unit into an external object may be accomplished with the processing control unit physically attached or not. In some instances it may not be desirable to physically attach the unit. Regardless of the type of physical attachment, the processing control unit is operably connected to the external object, meaning that the processing control unit is somehow functional with the external object itself to provide computing capabilities to or for the external object. As stated, this may be through existing or built-in circuitry, or installed circuitry, or through other means.

In one exemplary embodiment, processing control unit 2 is physically connected to the external object. The physical connection is made possible due to the "slide-on" or "snap-on" capabilities of processing control unit 2. By "slide-on," and "snap-on" it is meant that processing control unit 2 may accept various brackets, mounts, devices, etc. by sliding or snapping them into a suitable acceptor or receiver, respectively, located on processing control unit 2, such as slide receivers 82. In addition, an entire processing control unit 2 may be slid or snapped into another structure using the same receivers. Essentially, the present invention provides means of allowing processing control unit 2 to accept different peripheral items, or to be incorporated into another structure. In other embodiments, the particular methods and/or systems employed to mount the processing control unit to an external object may be those well known in the art.

Having said this, the processing control unit, due to its unique and proprietary design, can essentially function as the engine that drives and controls the operation of many components, structures, assemblies, equipment modules, etc.

Figure 9:
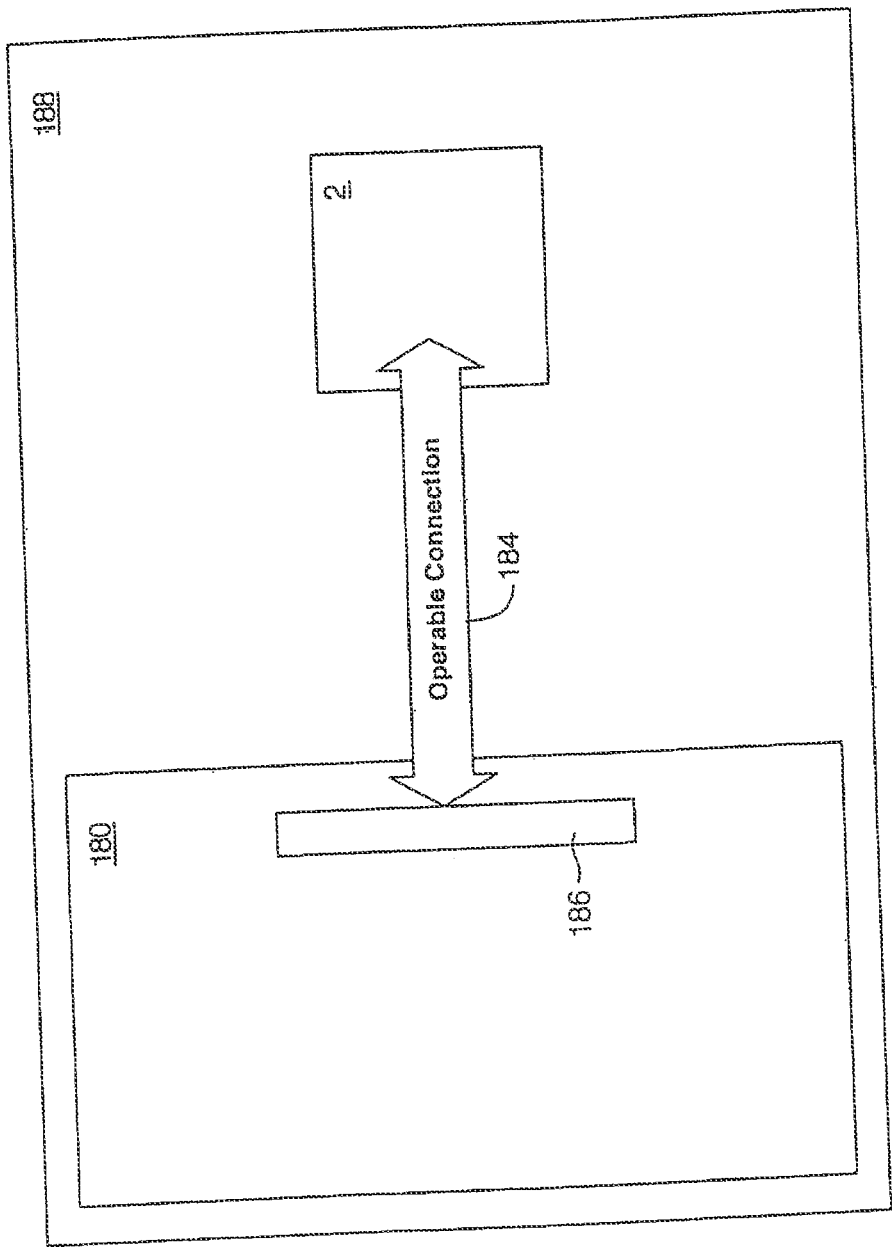
FIG. 9 illustrates a general block diagram of an exemplary robust customizable computing system or environment.

With reference to FIG. 9, shown is a general block diagram illustrating an external object 180 operably connected to a processing control unit 2 via means 184 for operably connecting an external object to a processing control unit to create a robust customizable computing system 188. This embodiment illustrates the ability of processing control unit 2 to connect to any type of external object to introduce smart technology into the external object. As shown, processing control unit is not part of the physical structure of external object 180, but is only electrically connected thereto. Although processing control unit 2 may be constructed to comprise significant load bearing capabilities, it may not always be desirable to integrate processing control unit 2 into the physical structure of the external object it is serving.

Means 184 for operably connecting processing control unit 2 to external object 180 may be achieved using any of the connection devices/systems and their associated connection methods (both physical and electrical) described above, as well as any such connection systems and methods known in the art. In one preferred exemplary embodiment, means for operably connecting 184 comprises an electrical connection utilizing one or more ports located on the dynamic back plane of processing control unit 2. The dynamic back plane may be used to electrically connect processing control unit 2 to any circuitry (not shown) existing within, built into, or otherwise present within or controlling external object 180 so that various smart functions may be performed or carried out with regards to or by external object 180 as a result of the computing and processing capabilities of processing control unit 2. Indeed, external object 180 may be caused to perform one or several smart functions particular to the type of external object, wherein the smart functions are initiated and/or executed by processing control unit 2 operably connected thereto. Connection through dynamic back plane may be direct using the universal port, or through one or more connection cables. For example, means for connecting may comprise a connection cable connecting the processing components of processing control unit 2 to any circuitry within or used for external object 180. Such a connection cable may comprise a serial port connection cable for connecting to a serial port, a USB connection cable for connecting through a USB port, etc. It is also contemplated that one or more wireless-type connections may be used. Each of the several electrical types of means for operably connecting will be apparent to one of ordinary skill in the art and are not discussed at length herein.

Figure 10:
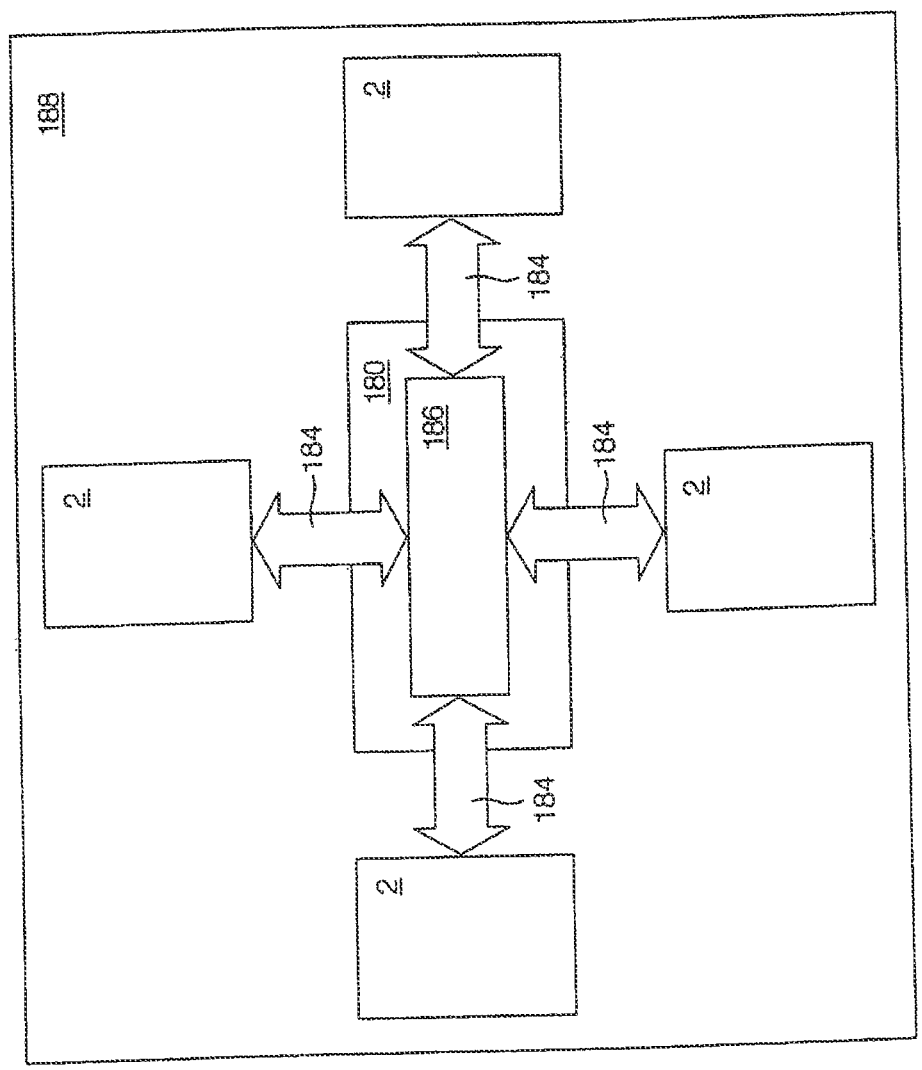
FIG. 10 illustrates a general block diagram of another exemplary robust customizable computing system, wherein a plurality of processing control units are operably connected to an external object.

FIG. 10 illustrates a block diagram of a robust customizable computing system 188 arranged similar to the system illustrated in FIG. 9, only the robust customizable computing system illustrated in FIG. 10 comprises plurality of processing control units 2 operably connected to a single external object 180. In this exemplary embodiment, four processing control units 2 are utilized, each providing additional (and/or scaled, if so desired) computing and processing power to introduce increased or additional or scaled smart technology to external object 180. One ordinarily skilled in the art will recognize that any number of processing control units may be used to cause external object 180 to perform as desired, or that a plurality of processing control units may be operably coupled to a plurality of external objects as a single system, etc. In addition, one ordinarily skilled in the art will recognize that a plurality of processing control units may be implemented in a system, but made to operate independent of one another or to perform independent or related tasks.

Figure 11:
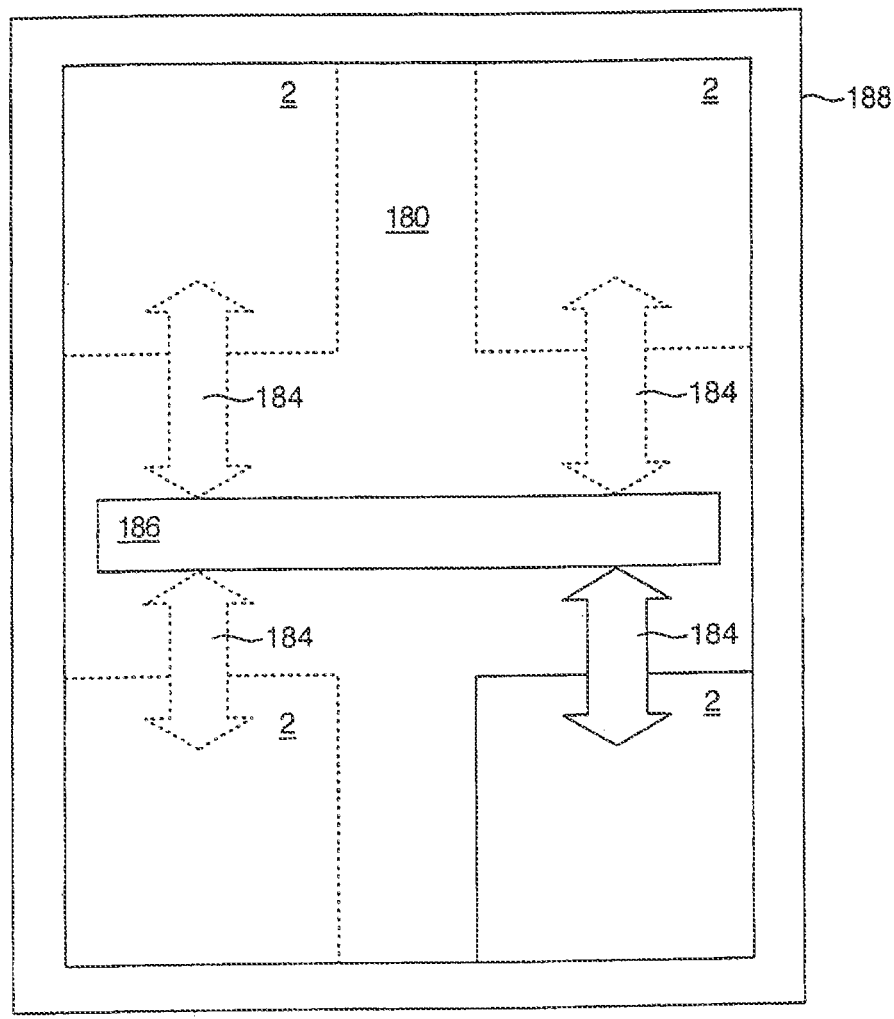
FIG. 11 illustrates a general block diagram of an exemplary robust customizable computing system comprising a processing control unit operably connected to an external object and functioning as a support load bearing member.

With reference to FIG. 11, shown is a block diagram of another general and illustrative robust customizable computing system, wherein processing control unit 2 is physically contained within or is physically part of the structure of an external object, or is physically mounted to an external object, or is supportive of an external object, or is otherwise physically coupled to an external object, such that processing control unit 2 provides additional functionality in addition to its computing functions. As such, means for operably connecting further comprises one or more types of physical connection means or means for physically connecting processing control unit 2 to external object 180, such as means for engaging an external object discussed above, or any other known device, system, or method. For instance, processing control unit, due to its design and material composition, can simply serve as a component of an external object or it can serve as a load bearing member within (e.g., part of the structure of the external object itself) or for (e.g., in support of a structure or device coupled or mounted to the processing control unit) an external object. In any of these arrangements, a robust customizable computing system 188 similar to the one discussed above is achieved, only processing control unit 2 is physically coupled to external object 180. Although FIG. 11 illustrates a plurality of processing control units 2 physically coupled to external object 180, it is contemplated that the robust customizable computing system may only comprise a single processing control unit 2.

In the robust customizable computing system shown in FIG. 11 where processing control unit 2 is physically coupled to external object 180, the preferred means for operably connecting comprises a direct connection between processing control unit 2 and external object 180 through the universal port located on the dynamic back plane of processing control unit 2 according to the principles and concepts discussed above. Of course, other connection methods and systems are possible and contemplated herein.

Figure 12:
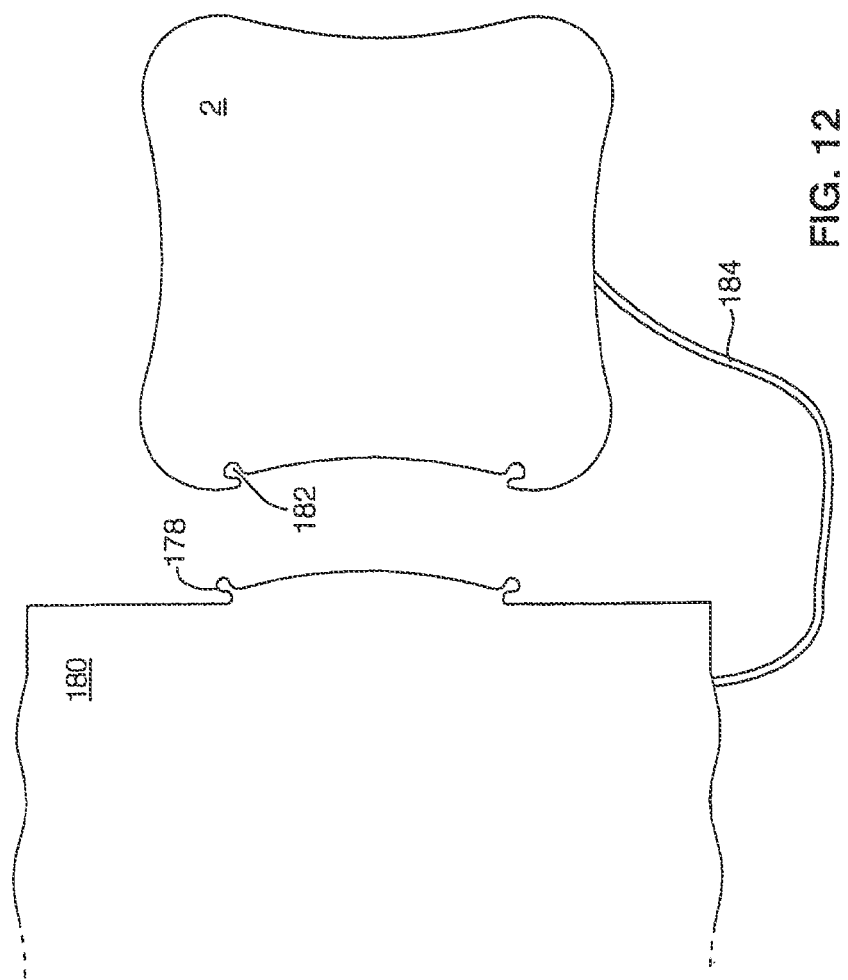
FIG. 12 illustrates generally a processing control unit operably connecting to an external object of any type.

FIG. 12 illustrates one exemplary embodiment for coupling processing control unit 2 to external object 180. In the embodiment shown, processing control unit 2 is operably coupled in an electrical and physical manner to external object 180. Physical connection is achieved by locating engagement members 178 formed on external object 180 and fitting or inserting these into slide receivers 182 located on processing control unit 2 (see discussion above with respect to FIG. 4). Inserting engagement members 178 into slide receivers 182 effectively functions to physically connect processing control unit 2 to external object 180, such that processing control unit may serve as a structural component (e.g., load bearing or non-load bearing) of the external object itself, or as the support for one or more external objects. Of course, as one ordinarily skilled in the art will recognize, other methods and systems may be used to physically connect processing control unit to external object 180, each of which are intended to be covered and protected herein.

FIG. 12 further illustrates means for operably connecting processing control unit 2 to external object 180 as comprising a connection cord connecting the circuitry present about or within external object 180 with that of processing control unit 2. This is preferably done through one or more ports of processing control unit 2.

The processing control unit is capable of being arranged in countless ways to provide a robust customizable computing system. Several such systems are provided below for illustrative purposes. It should be noted that the following examples are not to be construed as limiting in any way, as one ordinarily skilled in the art will recognize the virtually endless conceivable arrangements and systems that may comprise one or more processing control units to create a robust customizable computing system, as well as the many different types of enterprise applications that may utilize such a system.

Example One

Although it is contemplated that the processing control unit of the present invention will be adaptable to any conceivable environment, one of its primary enterprise applications will still be a computer or computing system where it will function as a normal computer system or workstation for the home or office. In a home or office setting, the processing control unit provides the ability to free up much needed space, to be camouflaged, or to be hidden from view altogether. The size and weight of the unit make it very portable and easy to move around, as well as providing space benefits not available with prior related computer encasements.

In addition, due to the processing control unit's ability to process couple to another processing control unit to achieve scaled processing, conventional computer systems, such as those built for the telecommunications industry, can be eliminated. For example, instead of housing several servers in a building at a telecommunications tower as is currently the practice, a plurality of processing control units of the present invention can be process-coupled together and mounted directly to the tower, wherein they are capable of providing the same amount of, if not more, processing power as prior art servers.

Figure 13:
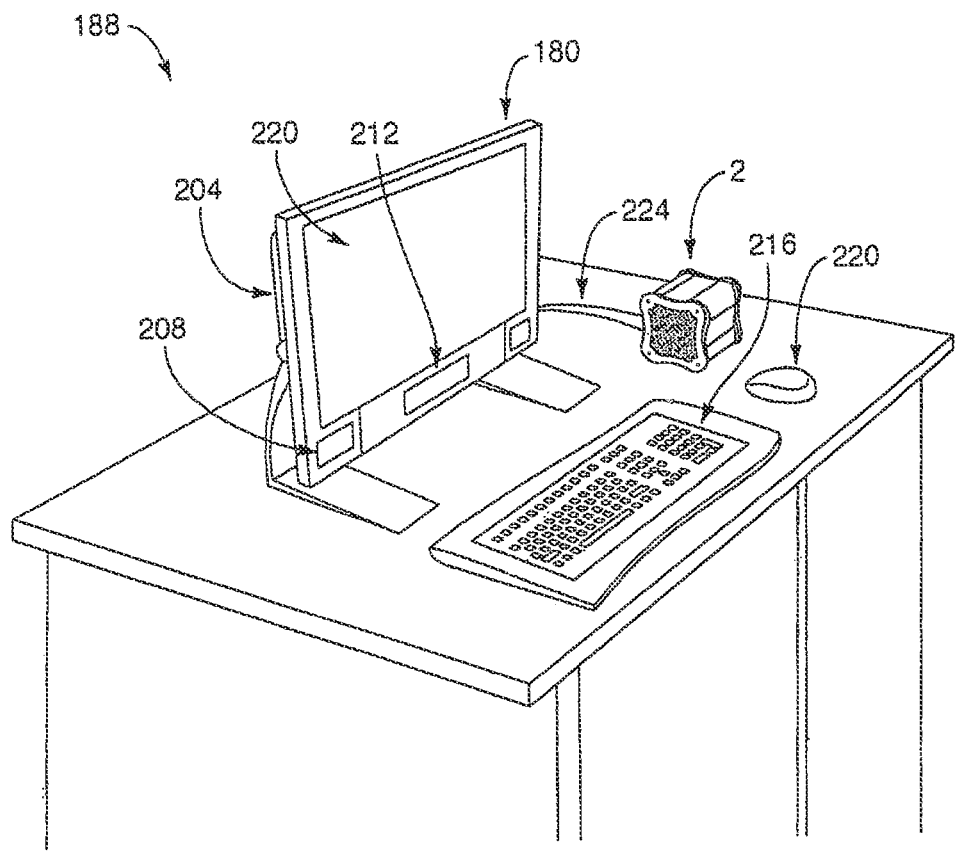
FIG. 13 illustrates an exemplary robust customizable computing system in the form of a desktop computer.

With reference to FIG. 13, shown is a robust customizable computing system 188 in the form of a computer to be utilized within a workstation environment. In this particular arrangement, processing control unit 2 functions as prior related computers to provide the computing source and to control the peripheral components within the workstation. Processing control unit 2 preferably comprises a non-peripheral based encasement. In the illustrated embodiment, robust customizable computing system 188 comprises processing control unit 2 operably connected to monitor 200 via means for connecting 184. The computer workstation also comprises hard disk drive 204, speakers 208, CD ROM drive 212, keyboard 216, mouse 220, and power connection 224. Means for operably connecting comprises a wired connection between processing control unit 2 and monitor 200, and a wireless technology between several peripheral devices. Processing control unit 2 is the driving force since it provides the processing power to manipulate data in order to perform tasks.

While FIG. 13 illustrates processing control unit 2 as a stand-alone component sitting atop a desk, the robust nature of the processing unit 2 allows it to alternatively be placed in a non-conspicuous place, such as in a wall, mounted underneath the desk, in an ornamental device or object, etc. Accordingly, the illustrated embodiment eliminates traditional towers that tend to be kicked and that tend to produce sound from the cooling system inside of the tower.

Example Two

Figure 14:
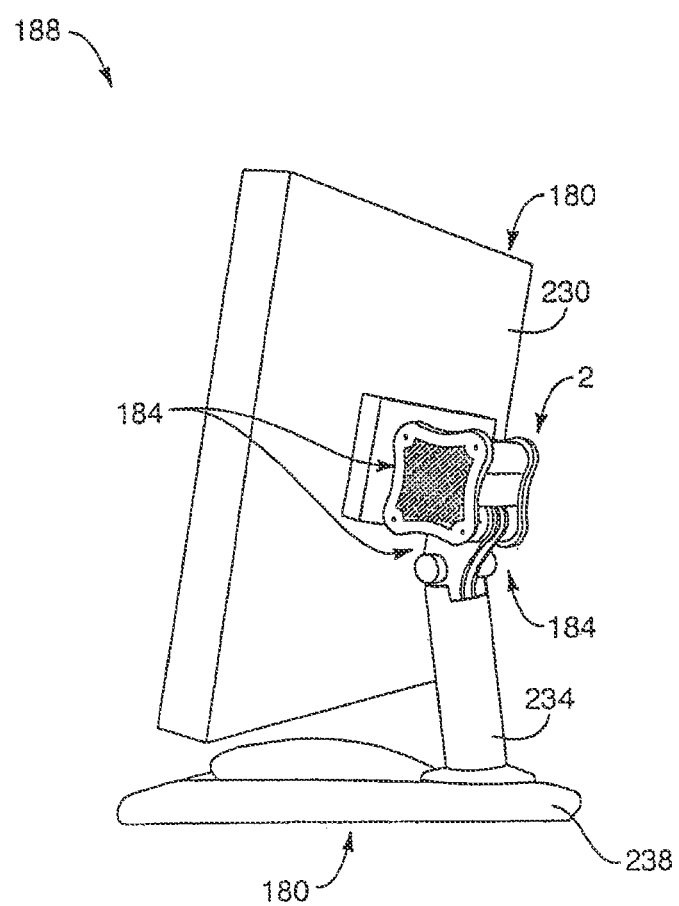
FIG. 14 illustrates an exemplary robust customizable computing system in the form of a computer physically supported by a processing control unit.

With reference to FIG. 14, shown is another robust customizable computing system in the form of a computer to be utilized within a workstation environment. This embodiment, however, is different from the embodiment shown in FIG. 13 in that processing control unit 2 functions as physical support for one or more external objects 180, namely monitor 230, extension arm 234, and a base or stand 238. Furthermore, processing control unit 2 is operably connected to external object 180 in an electrical as well as a physical manner. Specifically, processing control unit 2 functions as a load bearing member in addition to being the processing component of the computer and being electrically connected to the monitor and any other peripheral computing devices (e.g., a mouse and keyboard, etc.). In this exemplary embodiment, processing control unit 2 is a load bearing member that supports monitor 230 in a suspended state. In addition, processing control unit 2 is coupled to extension arm 234 of stand 238 in the elevated position shown, thus bridging monitor 230 and stand 238 together, as well as contributing to the overall structural support and stability of the robust computing system. In this embodiment, it is shown that processing control unit 2 may bear a load attached directly to its encasement or main support chassis. Also, means 184 for operably connecting comprises an electrical wired connection in addition to its specific physical connection (not shown).

Example Three

Figure 15A:
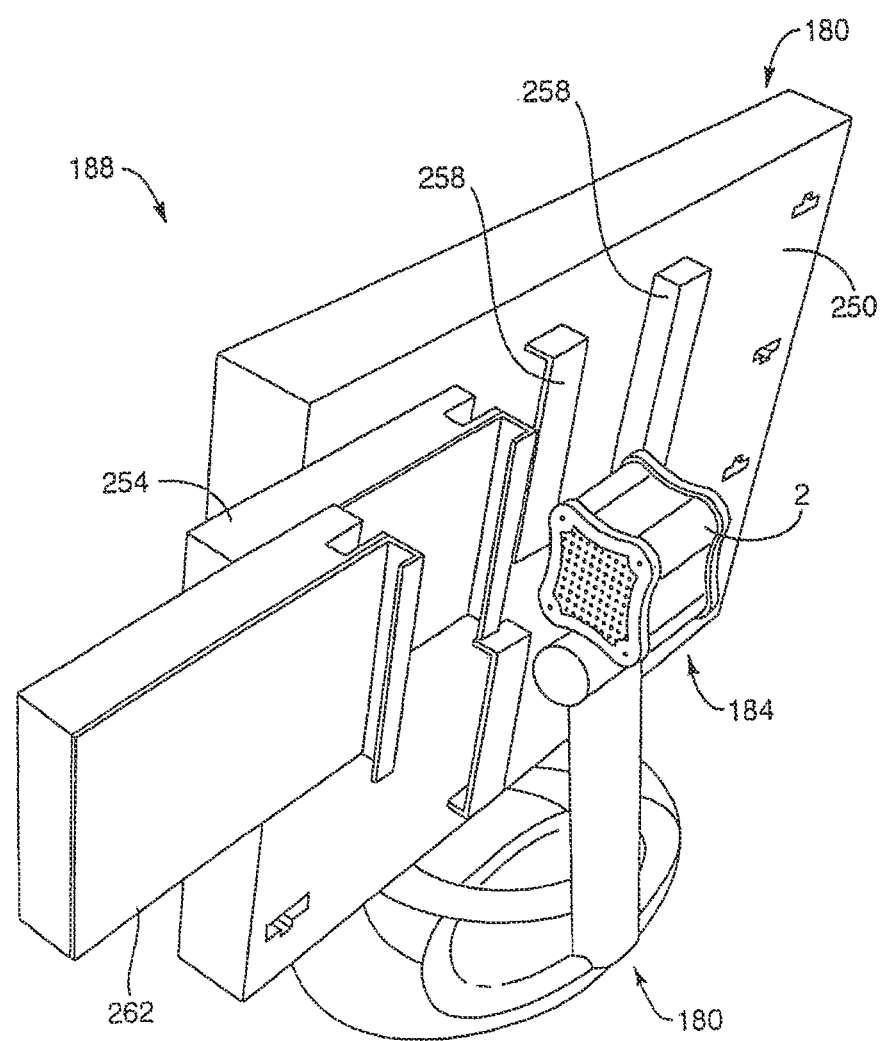
FIG. 15-A illustrates an exemplary robust customizable computing system in the form of a computer having snap-on peripherals.
Figure 15B:
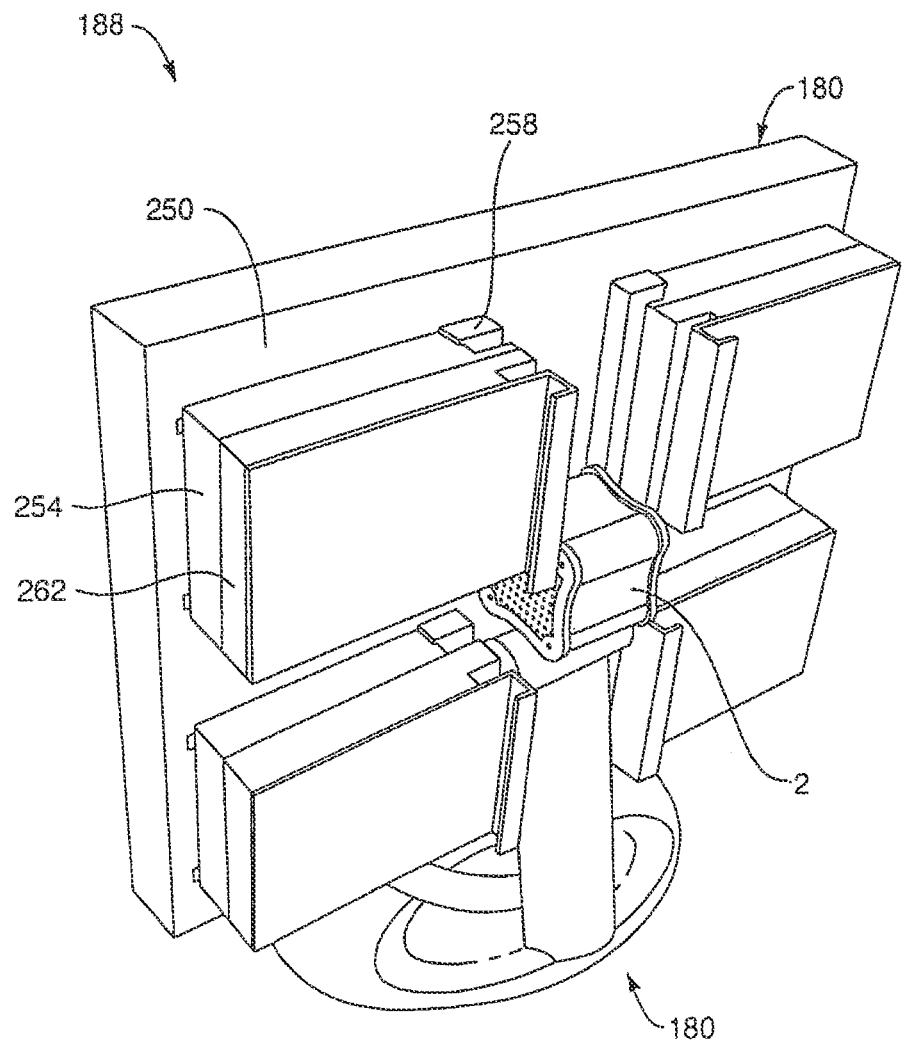

FIGS. 15-A and 15-B illustrate a robust customizable computing system similar to the system or embodiment described in FIG. 14, only the system or embodiments in FIGS. 15-A and 15-B illustrate processing control unit 2 operating or functioning as the control center for a desktop computer system having snap-on peripheral devices. As shown, peripheral devices may be supported by processing control unit 2 through external connection to processing control unit 2. In the exemplary embodiment shown in the Figures, the present invention contemplates using snap-on peripheral devices that essentially snap on to a universal peripheral panel 250 that is plugged into and electrically coupled to processing control unit 2 and the specific interconnects or peripherals transports via the dynamic back plane of processing control unit 2. In this embodiment, universal peripherals panel 250 is essentially the back portion of a monitor or LCD screen physically and electrically supported by processing control unit 2. A first peripheral device 254 (such as a CD-ROM drive) may be snapped into universal peripheral panel 250 using connection means 258. Connection means 258 are equipped with electrical connectors that allow first peripheral device 254 to interface with and electrically connect to processing control unit 2. In addition, first peripheral device 254 is equipped with an identified connector that allows it to connect with and function with connection means 258 to function and connect with the proper interconnect on the back plane required for use by first peripheral device 254 to operate. Still further, first peripheral device 254 may comprise connectors thereon similar to those found within universal peripheral panel 250 in order to allow a second peripheral device 262 to be attached to and electrically connected to first peripheral device 254, as shown, and additionally to processing control unit 2. Using this type of peripheral and connection technique and system, various peripherals can be stacked for more ease of use and removal. In addition, a great amount of interchangeability is provided, whereby various peripheral devices may be attached and detached as desired.

Example Four

Figure 16:
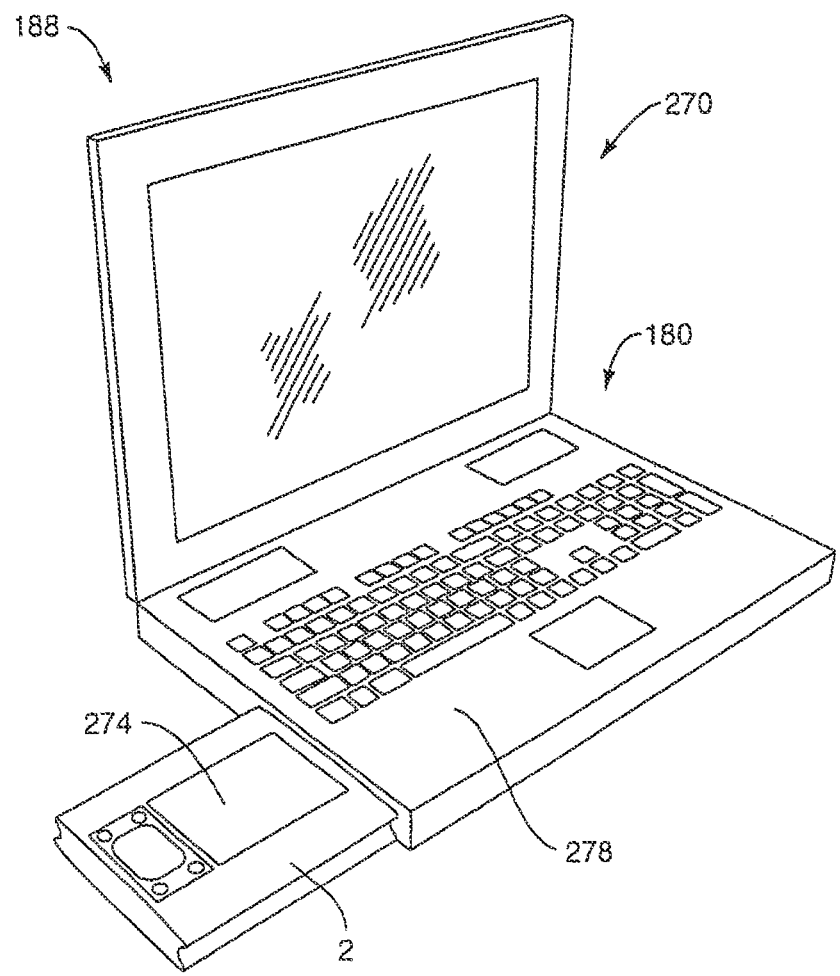
FIG. 16 illustrates an exemplary robust customizable computing system in the form of a laptop or other similar portable computer.

FIG. 16 illustrates a robust customizable computing system 188, wherein external object 180 is in the form of a laptop computer 270. Processing control unit 2, having an I/O peripheral 274, is selectively coupled to peripheral 278 to allow the representative system to function as a high-end laptop computer. As illustrated in FIG. 16, processing control unit 2 may be selectively inserted like a cartridge into a large I/O peripheral 274, which includes a keyboard, monitor, speakers, and optionally logic depending on end user application. Once unit 2 is decoupled/ejected from peripheral 278, unit 2 can retain the files to allow the user to always have his/her files therewith. Accordingly, there is no need to synchronize unit 2 with peripheral 278 since unit 2 includes all of the files. While the embodiment illustrated in FIG. 16 includes one modular processing unit, other embodiments of the present invention embrace the utilization of multiple processing units. Similarly, modular processing unit 2 may be inserted or otherwise coupled to a variety of other types of peripherals, including an enterprise in a vehicle, at home, at the office, or the like. Unit 2 may be used to preserve and provide music, movies, pictures or any other audio and/or video.

Example Five

Figure 17:
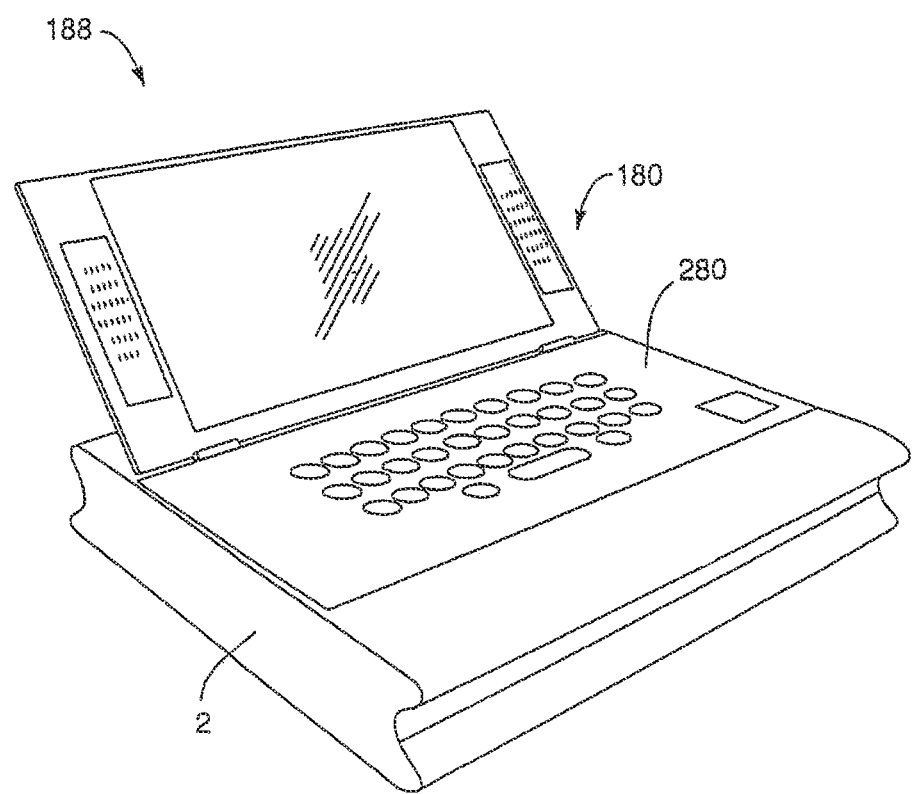
FIG. 17 illustrates an exemplary robust customizable computing system similar to the one illustrated in FIG. 16, namely a portable computer.

FIG. 17 illustrates a robust customizable computing system 188, wherein external object 180 is in the form of a flip top peripheral 280, which includes a monitor, thumb keyboard and mouse device.

Example Six

Figure 18:
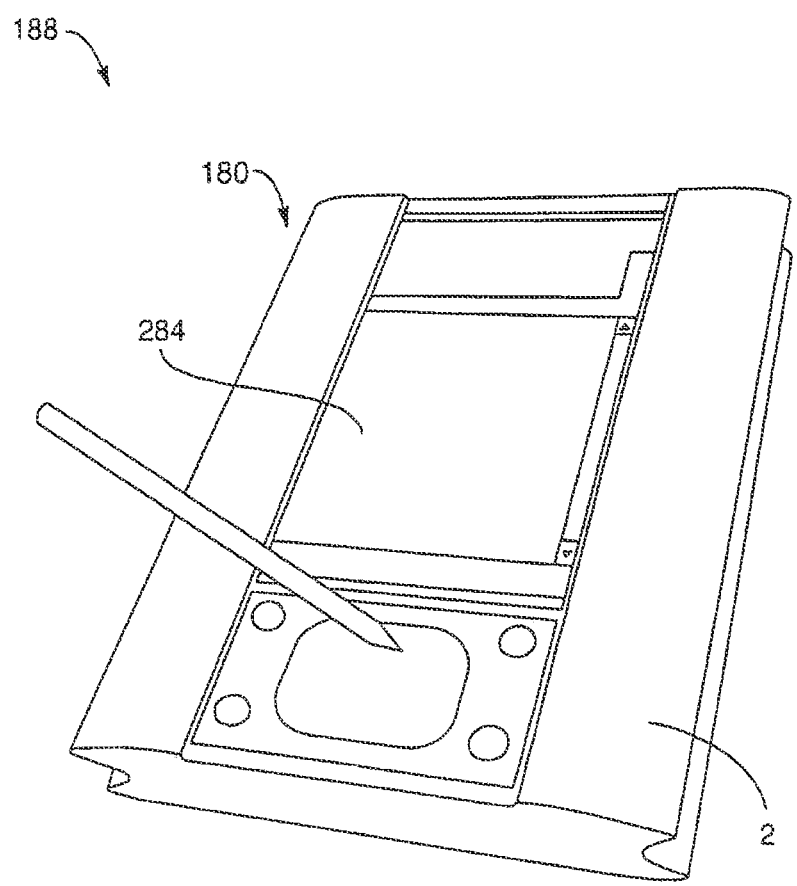
FIG. 18 illustrates an exemplary robust customizable computing system in the form of a hand-held device.

FIG. 18 illustrates a robust customizable computing system 188, wherein external object 180 is in the form of a hand-held peripheral 284.

Example Seven

Figure 19:
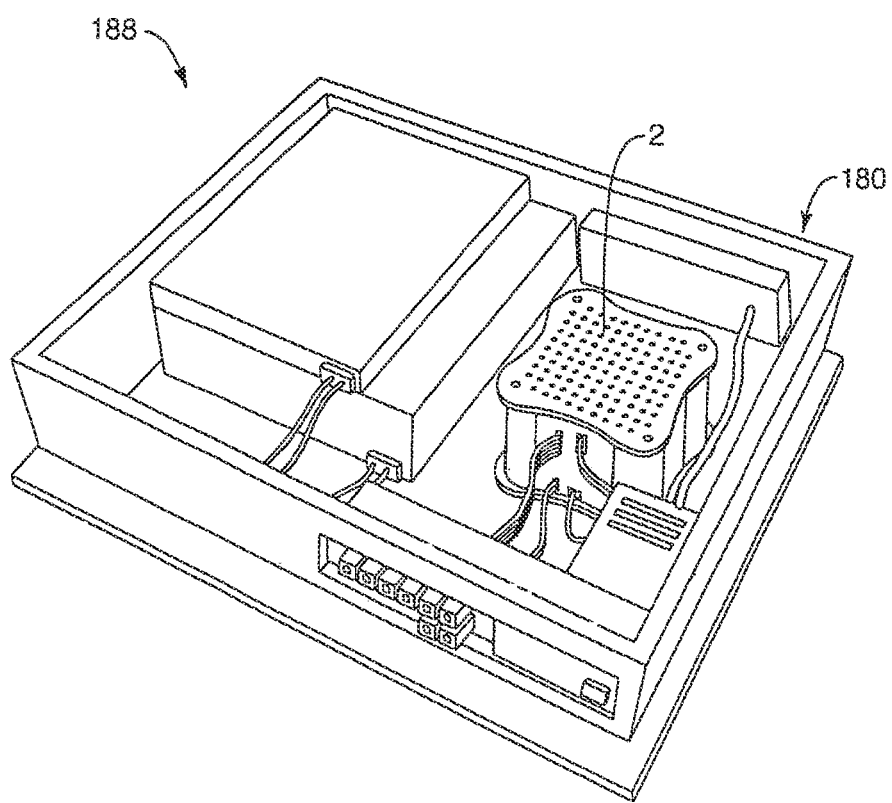
FIG. 19 illustrates an exemplary robust customizable computing system in the form of an electronics component.

FIG. 19 illustrates a robust customizable computing system 188, wherein external object 180 is in the form of an electronic device, such as a DVD player. In accordance with at least some embodiments of the present invention, processing control unit 2, having a non-peripheral based encasement, may be employed in a central processing unit or in other electronic devices, including a television, a stereo system, a recording unit, a set top box, a DVD/CD player, or any other electronic device.

Example Eight

Figure 20:
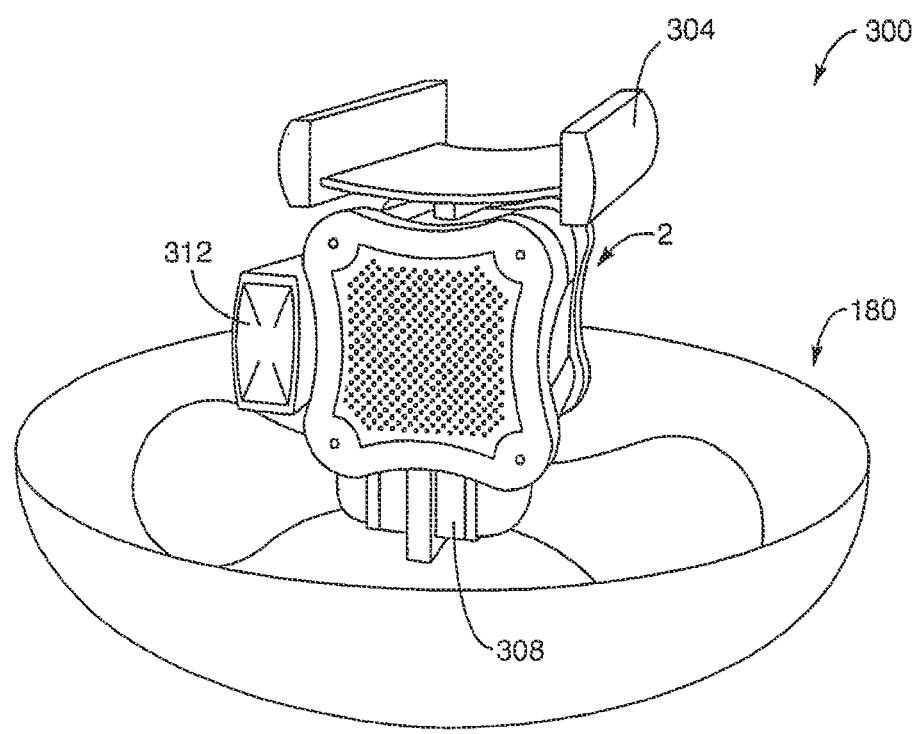
FIG. 20 illustrates an exemplary robust customizable computing system in the form of a light fixture.

FIG. 20 illustrates a robust customizable computing system 188, wherein external object 180 is in the form of a light fixture 300. Specifically, FIG. 15 illustrates how processing control unit 2 may be implemented into lighting fixture 230 to control the on/off, dimming (via slide-on dimmer 312), and other attributes of lighting fixture 300, such as monitoring the wattage used by the bulb and alerting a control center of any maintenance required, or any other desirable function. Processing control unit 2 is shown operably connected to slide-on lighting module 308 which is inserted into slide receivers (not shown) located in the main support chassis of processing control unit 2, as described above. Lighting module 308 supports one or more light bulbs and a cover, as shown. Processing control unit 2 is in turn mounted to a ceiling structure via slide-on mounting bracket 304, which also couples to processing control unit 2 using slide receivers. Mounting bracket 304 in turn couples to a ceiling or wall for hanging lighting fixture 300.

Example Nine

Figure 21:
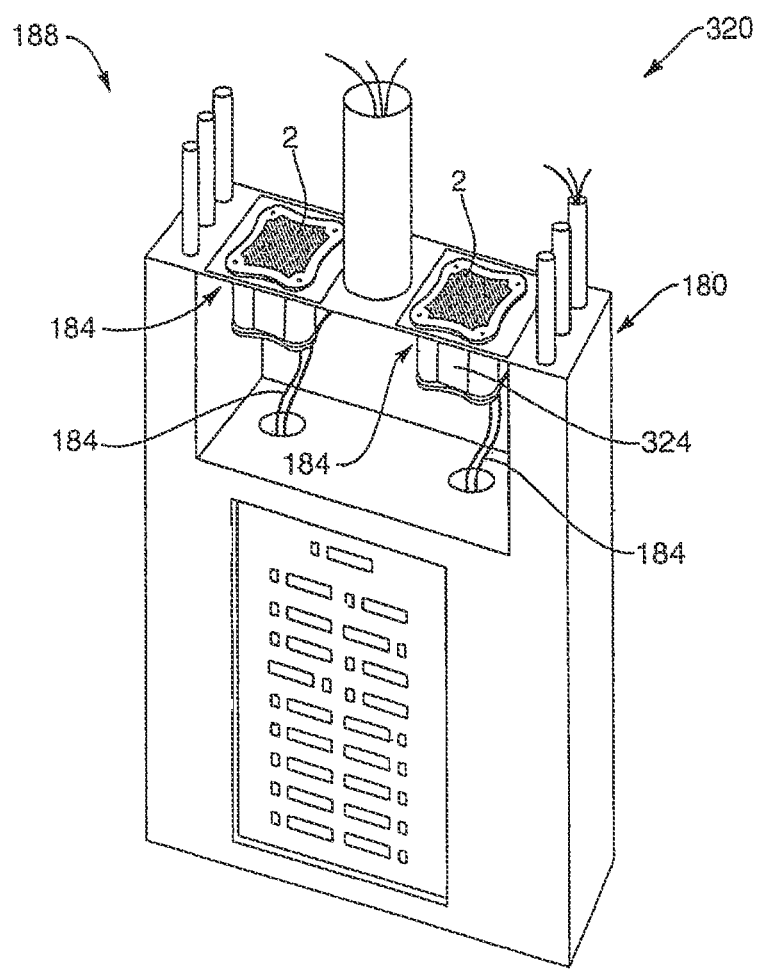
FIG. 21 illustrates an exemplary robust customizable computing system in the form of a breaker box.

FIG. 21 illustrates a robust customizable computing system 188, wherein external object 180 is in the form of a residential voltage monitoring breaker box 320. Specifically, processing control unit 2 is shown transforming a standard breaker box into a residential voltage monitoring breaker box 320. In this exemplary setup, dual redundant processing control units 2 function to process control breaker box 320 and monitor the voltage, in real-time, existing within breaker box 320 and throughout the house. Attached to each processing control unit 2 are voltage monitoring back plates 324, which attach using slide receivers 82 (not shown). Processing control unit 2 may further be directed to cause breaker box 320 to perform other smart functions related to the operation and control of breaker box 320. It should be noted that this exemplary robust customizable computing system comprises two processing control units to control a single external object. One ordinarily skilled in the art will recognize that other similar arrangements are possible.

Example Ten

Figure 22:
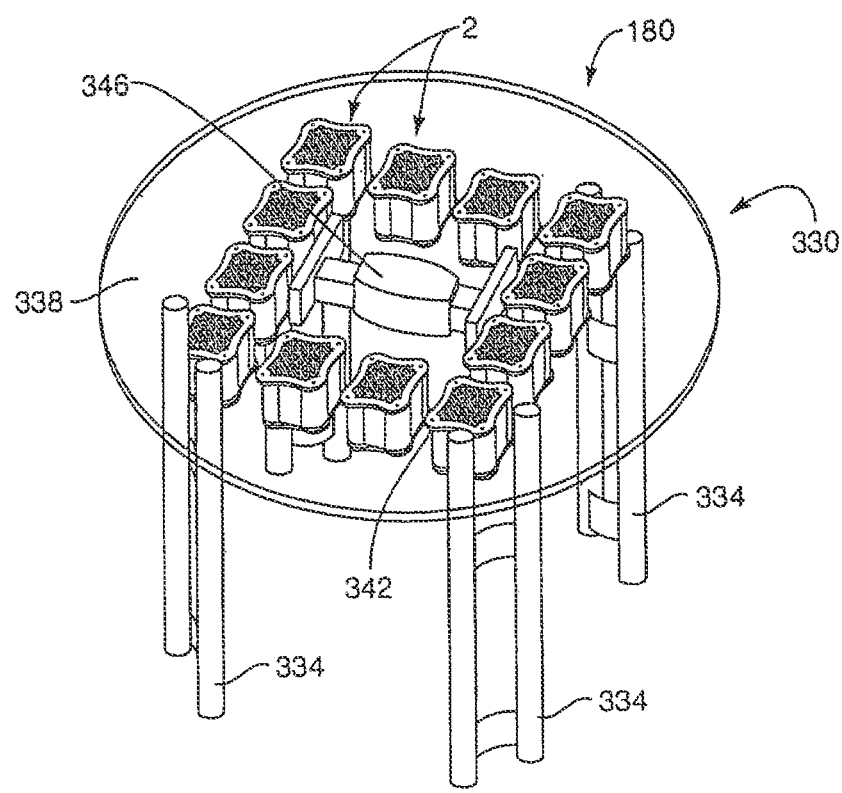
FIG. 22 illustrates an exemplary robust customizable computing system in the form of a table assembly.

FIG. 22 illustrates a robust customizable computing system 188, wherein external object 180 is in the form of a table or table assembly 330. In this embodiment, multiple processing control units 2 are utilized and makeup the load bearing components of table 330, namely the components that connect to legs 334 and top 338, as well as to introduce smart technology into table 330, thus allowing it to perform one or more smart functions. Table assembly 330 employs slide-on leg mounts 334 that couple to processing control units 2 using one or more connection means to comprise the legs of table assembly 330. In addition, processing control units 2 are operably connected together (i.e., physically and/or electrically) using load bearing connectors 342. Also shown is a slide-on DVD and hard drive module 346 that allows table assembly 330 to perform various additional smart functions.

Example Eleven

Figure 23:
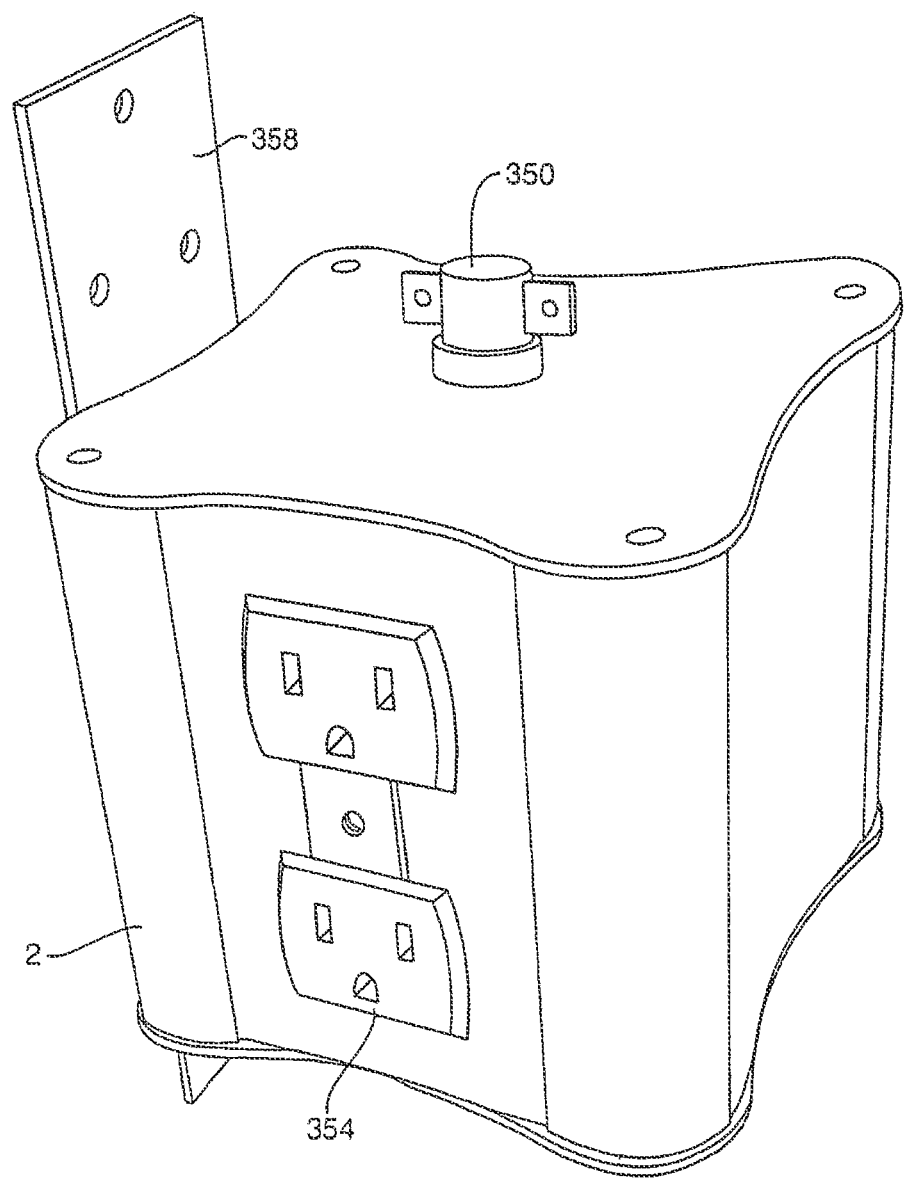
FIG. 23 illustrates an exemplary robust customizable computing system in the form of an outlet plug.

FIG. 23 illustrates a robust customizable computing system 188, wherein external object 180 is in the form of an electrical outlet or plug that is used for, among other things, 802.11x distribution. Processing control unit 2 is coupled to an AC interface 350, AC plug peripheral 354, and mounting bracket 358. AC plug peripheral 354 and mounting bracket 358 are slide-on peripherals. Processing control unit 2 is powered by the ac distribution into unit 2 and is used as a smart plug to monitor, control, oversee, and/or allocate power distribution.

In one embodiment, processing control unit 2 is utilized as a router. In another embodiment, it is employed as a security system. In another embodiment, processing control unit 2 monitors electrical distribution and disconnects power as needed to ensure safety. For example, processing control unit 2 is able to detect is an individual has come in contact with the electrical distribution and automatically shuts off the power. In some embodiments, technologies, such as X10 based technologies or other technologies, are used to connect multiple enterprises over copper wire lines. In further embodiments, the multiple enterprises exchange data over, for example, a TCP/IP or other protocol.

As stated above, the above robust customizable computing systems and illustrated enterprise applications are merely exemplary of some of the external objects and applications that may be possible. Indeed, one of ordinary skill in the art will recognize many other configurations, environments, applications, and set-ups, all of which are intended to be within the scope of the present detailed description and appended claims. Accordingly, embodiments of the present invention embrace the utilization of a processing control unit in association with various mundane products to form a smart product within a robust customizable computing system. Although not exhaustive, other examples of products, systems and devices with a processing control unit may be used to provide a smart product, system and/or device. Some examples include a heating/cooling system, a water distribution system, a power distribution system, furniture, fixtures, equipment, gears, drills, tools, buildings, artificial intelligence, vehicles, sensors, video and/or audio systems, security systems, and many more products, systems and/or devices.

For example, the processing control unit may be operably connected to a furnace to control the efficiency of the furnace system. If the efficiency decreases, the processing control unit may be programmed to provide the owner of the building, for example in an email communication, to change filters, service the system, identify a failure, or the like. Similarly, a processing control unit may be used in association with a water supply to monitor the purity of the water and provide a warning in the event of contamination. Similarly, appliances (e.g., washers, dryers, dishwashers, refrigerators, and the like) may be made smart when used in association with a processing control unit. Furthermore, the processing control units may be used in association with a system that provides security, including detecting carbon monoxide, anthrax or other biological agents, radiological agents, or another agents or harmful substances. Moreover, due to the stability and versatility of the processing control units, they may be placed in locations previously unavailable. In at least some embodiments, the use of a processing control unit with a super structure allows the processing control unit to take on qualities of the super structure.

As another example, the processing control unit may be mounted on the inside or outside of a house or other structure or building to be used to deploy 802.11x networks or smart home technology right into the house structure, such using with various appliances, thus transforming them into "smart" appliances.

Processing control unit 2 may also be used as an acceptable omni-directional and/or directional antenna for hardwire networking systems or wireless networking standards, such as 802.11a, 802.11b, and blue tooth. This is made possible through its preferable metal design and ability to be adaptable to be placed in various environments where it may receive and capture a transmission signal.

Processing control unit 2, and particularly first, second, and third insert members 66, 70, and 74, may also be designed and adapted to perform other functions. For example a light slide may be utilized to act as a wiring harness supplying power and data to other slide-on pieces.

These illustrations are merely exemplary of the capabilities of one or more modular processing units in accordance with embodiments of the present invention. Indeed, while illustrative embodiments of the invention have been described herein, the present invention is not limited to the various preferred embodiments described herein, but rather includes any and all embodiments having modifications, omissions, combinations (e.g., of aspects across various embodiments), adaptations and/or alterations as would be appreciated by those in the art based on the present disclosure. The limitations in the claims are to be interpreted broadly based the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" is expressly recited; and b) a corresponding function is expressly recited.

The present invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed and desired to be secured by Letters Patent is:

1. A non-hinged computer device comprising:
   an outer housing having six faces;
   a processor that is disposed within the outer housing; and
   multiple pluggable input interfaces that are disposed at an external surface of the computer device and that are configured to physically and electrically connect the computer device to an external input device, wherein all of the pluggable input interfaces are disposed at a first face of the six faces of the outer housing.

2. The computer device of claim 1, wherein three faces of the six faces comprise one monolithic and contiguous piece of material.

3. The computer device of claim 1, wherein the six faces of the outer housing further comprise a second face, a third face, a fourth face, a fifth face, and a sixth face,
   wherein the first face is disposed substantially opposite to the second face,
   wherein the third face is disposed substantially opposite to the fourth face,
   wherein the fifth face is disposed substantially opposite to the six face, and
   wherein the second face and the third face comprise one monolithic and contiguous piece of material.

4. The computer device of claim 3, wherein the second face, the third face, and the fourth face comprise the one monolithic and contiguous piece of material.

5. The computer device of claim 3, further comprising:
   a first rounded edge that is disposed between, and that extends along a length of, the second face and the third face; and
   a second rounded edge that is disposed between, and that extends along a length of, the second face and that fourth face, and
   wherein a length of the first rounded edge is substantially parallel to a length of the second rounded edge.

6. The computer device of claim 5, further comprising:
   a third rounded edge that is disposed between, and that extends along a length of, the first face and the third face; and
   a fourth rounded edge that is disposed between, and that extends along a length of, the first face and that fourth face, and
   wherein a length of the third rounded edge is substantially parallel to a length of the fourth rounded edge.

7. The computer device of claim 2, wherein all switches of the computer device that are externally mounted on the computer device and that are manually operated are disposed at the first face.

8. The computer device of claim 1, further comprising, a monitor, wherein the monitor comprises a front surface comprising a display, and a back surface that is substantially opposite to the front surface, and wherein the computer device is coupled to the monitor and is disposed adjacent to the back surface of the monitor.

9. The computer device of claim 1, wherein the input interfaces comprise a touch screen input.

10. A non-hinged computer device comprising:
an outer housing having a first face, a second face, a third face a fourth face, a fifth face, and a sixth face, wherein the first face is disposed substantially opposite to the second face, wherein the third face is disposed substantially opposite to the fourth face, and wherein the fifth face is disposed substantially opposite to the six face;
a processor that is disposed within the outer housing;
multiple pluggable interfaces that are disposed at an external surface of the non-hinged computer device and that are configured to pluggably and electrically couple at least one of: (i) an input device and (ii) an output device to the non-hinged computer device, wherein all of the pluggable interfaces are disposed at the first face of the outer housing, and wherein the pluggable interfaces comprise a power cord interface; and
a power switch that is disposed at the first face.

11. The non-hinged computer device of claim 10, wherein the second face and the third face comprise one monolithic and contiguous piece of material.

12. The non-hinged computer device, of claim 11, wherein the second face, the third face, and the fourth face comprise the one monolithic and contiguous piece of material.

13. The non-hinged computer device of claim 12, wherein the first face selectively couples to the one monolithic and contiguous piece of material.

14. A non-hinged computer device comprising:
an outer housing having a first face, a second face, a third face, a fourth face, a fifth face, and a sixth face, wherein the first face is disposed substantially opposite to the second face, wherein the third face is disposed substantially opposite to the fourth face, and wherein the fifth face is disposed substantially opposite to the sixth face;
a processor that is disposed within the outer housing;
multiple pluggable interfaces that are disposed at an external surface of the non-hinged computer device and that are configured to pluggably and electrically couple at least one of: (i) an input device and (ii) an output device to the non-hinged computer device, wherein all of the pluggable interfaces are disposed at a first face of the six faces of the outer housing, and wherein the pluggable interfaces comprise a power cord interface; and
a power switch for the non-hinged computer device that is disposed at the first face,
wherein the second face, the third face, and the fourth face comprise one monolithic and contiguous piece of material,
wherein a first rounded edge of the outer housing is disposed between, and extends along a length of, the second face and the third face,
wherein a second rounded edge is disposed between, and extends along a length of, the second face and the fourth face,
wherein a third rounded edge is disposed between, and extends along a length of, the first face and the third face,
wherein a fourth rounded edge is disposed between, and extends along a length of, the first face and the fourth face, and
wherein a length of the first rounded edge is substantially parallel to a length of the second rounded edge, a length of the third rounded edge, and a length of the fourth rounded edge.

15. The non-binged computer device of claim 14, wherein the second face, the third face, the fourth face, the first rounded edge, the second rounded edge, the third rounded edge, and the fourth rounded edge all are part of the one monolithic and contiguous piece of material.

16. The non-hinged computer device of claim 14, wherein the one monolithic and contiguous piece of material comprises aluminum.

17. The non-binged computer device of claim 14, wherein all input interfaces of the non-hinged computer device are disposed at the first face.

18. The non-hinged computer device of claim 15, wherein the first face is selectively removable from the outer housing.

19. The non-hinged computer device of claim 14, wherein the fifth face comprises orifices that provide ventilation to the non-hinged computer device.

20. The non-binged computer device of claim 14, wherein the non-hinged computer device comprises a monitor that couples to the first face.

* * * * *